(12) United States Patent
Vaidhyanathan et al.

(10) Patent No.: US 10,176,096 B2
(45) Date of Patent: Jan. 8, 2019

(54) PROVIDING SCALABLE DYNAMIC RANDOM ACCESS MEMORY (DRAM) CACHE MANAGEMENT USING DRAM CACHE INDICATOR CACHES

(71) Applicant: QUALCOMM Incorporated, San Diego, CA (US)

(72) Inventors: Natarajan Vaidhyanathan, Carrboro, NC (US); Mattheus Cornelis Antonius Adrianus Heddes, Raleigh, NC (US); Colin Beaton Verrilli, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 72 days.

(21) Appl. No.: 15/228,320

(22) Filed: Aug. 4, 2016

(65) Prior Publication Data
US 2017/0242793 A1    Aug. 24, 2017

Related U.S. Application Data

(60) Provisional application No. 62/298,088, filed on Feb. 22, 2016.

(51) Int. Cl.
*G06F 12/00* (2006.01)
*G06F 12/0804* (2016.01)
*G06F 12/0893* (2016.01)

(52) U.S. Cl.
CPC ...... *G06F 12/0804* (2013.01); *G06F 12/0893* (2013.01); *G06F 2212/1008* (2013.01);
(Continued)

(58) Field of Classification Search
CPC .......................... G06F 12/0804; G06F 12/0893
See application file for complete search history.

(56) References Cited

U.S. PATENT DOCUMENTS 5,355,467 A     10/1994  MacWilliams et al.
5,752,262 A  *   5/1998  Cassetti .............. G06F 12/0811
                                                711/135
(Continued)

FOREIGN PATENT DOCUMENTS

WO       2015152857 A1    10/2015

OTHER PUBLICATIONS

International Search Report and Written Opinion for PCT/US2017/016005, dated Apr. 21, 2017, 14 pages.
(Continued)

*Primary Examiner* — Prasith Thammavong
(74) *Attorney, Agent, or Firm* — Withrow & Terranova, PLLC

(57) ABSTRACT

Providing scalable dynamic random access memory (DRAM) cache management using DRAM cache indicator caches is provided. In one aspect, a DRAM cache management circuit is provided to manage access to a DRAM cache in high-bandwidth memory. The DRAM cache management circuit comprises a DRAM cache indicator cache, which stores master table entries that are read from a master table in a system memory DRAM and that contain DRAM cache indicators. The DRAM cache indicators enable the DRAM cache management circuit to determine whether a memory line in the system memory DRAM is cached in the DRAM cache of high-bandwidth memory, and, if so, in which way of the DRAM cache the memory line is stored. Based on the DRAM cache indicator cache, the DRAM cache management circuit may determine whether to employ the DRAM cache and/or the system memory DRAM to perform a memory access operation in an optimal manner.

47 Claims, 15 Drawing Sheets

(52) U.S. Cl.
CPC .... *G06F 2212/281* (2013.01); *G06F 2212/69* (2013.01); *G11C 2207/2245* (2013.01)

(56) References Cited

U.S. PATENT DOCUMENTS

| | | | | |
|---|---|---|---|---|
| 6,029,224 | A * | 2/2000 | Asthana | G06F 12/0607 |
| | | | | 710/119 |
| 6,092,155 | A * | 7/2000 | Olnowich | G06F 12/0817 |
| | | | | 709/200 |
| 6,173,368 | B1 * | 1/2001 | Krueger | G06F 12/0888 |
| | | | | 711/133 |
| 6,327,645 | B1 * | 12/2001 | Hsiao | G06F 12/0859 |
| | | | | 711/118 |
| 7,146,454 | B1 * | 12/2006 | Li | G06F 12/0893 |
| | | | | 711/6 |
| 7,818,519 | B2 | 10/2010 | Plunkett | |
| 7,958,312 | B2 | 6/2011 | Moll et al. | |
| 9,075,746 | B2 | 7/2015 | Hyuseinova et al. | |
| 9,086,973 | B2 | 7/2015 | Vorbach | |
| 9,286,221 | B1 * | 3/2016 | Sundararajan | G06F 12/0811 |
| 9,356,602 | B1 * | 5/2016 | Bielich | G06F 9/5016 |
| 2003/0204702 | A1 * | 10/2003 | Lomax, Jr. | G06F 12/0292 |
| | | | | 711/207 |
| 2006/0106984 | A1 * | 5/2006 | Bartley | G06F 12/08 |
| | | | | 711/118 |
| 2013/0254491 | A1 * | 9/2013 | Coleman | G06F 12/126 |
| | | | | 711/133 |
| 2014/0089598 | A1 * | 3/2014 | DeBruyne | G06F 9/30149 |
| | | | | 711/140 |
| 2014/0101388 | A1 * | 4/2014 | McCauley | G06F 12/0862 |
| | | | | 711/137 |
| 2015/0095582 | A1 * | 4/2015 | Assarpour | G06F 12/12 |
| | | | | 711/133 |

OTHER PUBLICATIONS

International Preliminary Report on Patentability for PCT/US2017/016005, dated May 28, 2018, 10 pages.

Second Written Opinion for PCT/US2017/016005, dated Jan. 25, 2018, 9 pages.

* cited by examiner

PROVIDING SCALABLE DYNAMIC RANDOM ACCESS MEMORY (DRAM) CACHE MANAGEMENT USING DRAM CACHE INDICATOR CACHES

PRIORITY CLAIM

The present application claims priority under 35 U.S.C. § 119(e) to U.S. Provisional Patent Application Ser. No. 62/298,088 filed on Feb. 22, 2016 and entitled "PROVIDING SCALABLE DYNAMIC RANDOM ACCESS MEMORY (DRAM) CACHE MANAGEMENT USING DRAM CACHE INDICATOR CACHES," the contents of which is incorporated herein by reference in its entirety.

BACKGROUND

I. Field of the Disclosure

The technology of the disclosure relates generally to dynamic random access memory (DRAM) management, and, in particular, to management of DRAM caches.

II. Background

The advent of die-stacked integrated circuits (ICs) composed of multiple stacked dies that are vertically interconnected has enabled the development of die-stacked dynamic random access memory (DRAM). Die-stacked DRAMs may be used to implement what is referred to herein as "high-bandwidth memory." High-bandwidth memory provides greater bandwidth than conventional system memory DRAM, while providing similar access latency. In some implementations, high-bandwidth memory may also be "near" memory, or memory that is physically located closer to a memory interface than other system memory DRAM. High-bandwidth memory may be used to implement a DRAM cache to store frequently accessed data that was previously read from a system memory DRAM and evicted from a higher level cache, such as a Level 3 (L3) cache as a non-limiting example. Providing a DRAM cache in high-bandwidth memory may reduce memory contention on the system memory DRAM, and thus, in effect, increase overall memory bandwidth.

However, management of a DRAM cache in a high-bandwidth memory can pose challenges. The DRAM cache may be orders of magnitude smaller in size than system memory DRAM. Thus, because the DRAM cache can only store a subset of the data in the system memory DRAM, efficient use of the DRAM cache depends on intelligent selection of memory addresses to be stored. Accordingly, a DRAM cache management mechanism should be capable of determining which memory addresses should be selectively installed in the DRAM cache, and should be further capable of determining when the memory addresses should be installed in and/or evicted from the DRAM cache. It may also be desirable for a DRAM cache management mechanism to minimize impact on access latency for the DRAM cache, and to be scalable with respect to the DRAM cache size and/or the system memory DRAM size.

Some approaches to DRAM cache management utilize a cache for storing tags corresponding to cached memory addresses, similar to how conventional caches may be managed. Under one such approach, all of the tags associated with a DRAM cache are stored in static random access memory (SRAM) on a compute die separate from the high-bandwidth memory. However, this approach may not be sufficiently scalable to the DRAM cache size, as larger DRAM cache sizes may require larger area for tags that are not desired and/or are too large to store in SRAM. Another approach involves locating the tags within the DRAM cache itself, instead of within the SRAM on the compute die, and using a hit/miss predictor to determine whether a given memory address is stored within the DRAM cache. While this latter approach minimizes the usage of SRAM in the compute die, any incorrect predictions will result in data being read from the system memory DRAM. For example, if the hit/miss predictor incorrectly predicts that the memory address is located in the DRAM cache, a latency penalty is incurred from an unnecessary read to the DRAM cache before reading the memory address from the system memory DRAM. Conversely, if the hit/miss predictor incorrectly predicts that the memory address is not located in the DRAM cache, an opportunity to avoid an unnecessary read to the system memory DRAM may be wasted. Unnecessary additional reads incur additional access latency, which may negate any performance improvements resulting from using the DRAM cache.

Thus, it is desirable to provide scalable DRAM cache management to improve memory bandwidth while minimizing SRAM consumption and latency penalties.

SUMMARY OF THE DISCLOSURE

Aspects disclosed in the detailed description include providing scalable dynamic random access memory (DRAM) cache management using DRAM cache indicator caches. In some aspects, a DRAM cache management circuit is provided to manage access to a DRAM cache in a high-bandwidth memory. The DRAM cache management circuit comprises a DRAM cache indicator cache that is used to cache master table entries that contain DRAM cache indicators, and that are read from a master table in a system memory DRAM. The DRAM cache indicators enable the DRAM cache management circuit to determine whether a memory line in the system memory DRAM is cached in the DRAM cache (i.e., implemented using the high-bandwidth memory), and, if so, in which way of the DRAM cache the memory line is stored. Based on the DRAM cache indicator cache, the DRAM cache management circuit can determine whether a memory operation may be performed using the DRAM cache and/or using the system memory DRAM. Some aspects of the DRAM cache management circuit may further provide a load balancing circuit. In circumstances in which data may be read from either the DRAM cache or the system memory DRAM, the DRAM cache management circuit may use the load balancing circuit to select an appropriate source from which to read data.

Further aspects of the DRAM cache management circuit may be configured to operate in a write-through mode or a write-back mode. In the latter aspect, the DRAM cache indicator cache may provide a dirty bit for each memory line stored therein. In some aspects, the DRAM cache and/or the DRAM cache indicator cache may be replenished based on a probabilistic determination by the DRAM cache management circuit. For example, the DRAM cache management circuit may be configured to replenish the DRAM cache and/or the DRAM cache indicator cache at random intervals such that only a percentage of randomly selected data is written to the DRAM cache and/or the DRAM cache indicator cache.

In another aspect, a DRAM cache management circuit is provided. The DRAM cache management circuit is communicatively coupled to a DRAM cache that is part of a high-bandwidth memory, and is further communicatively coupled to a system memory DRAM. The DRAM cache management circuit comprises a DRAM cache indicator cache that is configured to cache a plurality of DRAM cache indicators read from a master table in the system memory DRAM. The plurality of DRAM cache indicators indicate whether a corresponding memory line of the system memory DRAM is cached in the DRAM cache. The DRAM cache management circuit is configured to receive a memory read request comprising a read address. The DRAM cache management circuit is further configured to determine whether the read address is found in the DRAM cache indicator cache. The DRAM cache management circuit is also configured to, responsive to determining that the read address is not found in the DRAM cache indicator cache, read data at the read address in the system memory DRAM. The DRAM cache management circuit is additionally configured to, responsive to determining that the read address is found in the DRAM cache indicator cache, determine, based on the DRAM cache indicator cache, whether the read address is found in the DRAM cache. The DRAM cache management circuit is further configured to, responsive to determining that the read address is not found in the DRAM cache, read data at the read address in the system memory DRAM. The DRAM cache management circuit is also configured to, responsive to determining that the read address is found in the DRAM cache, read data for the read address from the DRAM cache.

In another aspect, a method for providing scalable DRAM cache management is provided. The method comprises receiving, by a DRAM cache management circuit, a memory read request comprising a read address. The method further comprises determining whether the read address is found in a DRAM cache indicator cache of the DRAM cache management circuit. The method also comprises, responsive to determining that the read address is not found in the DRAM cache indicator cache, reading data at the read address in a system memory DRAM. The method additionally comprises, responsive to determining that the read address is found in the DRAM cache indicator cache, determining, based on the DRAM cache indicator cache, whether the read address is found in a DRAM cache that is part of a high-bandwidth memory. The method also comprises, responsive to determining that the read address is not found in the DRAM cache, reading data at the read address in the system memory DRAM. The method additionally comprises, responsive to determining that the read address is found in the DRAM cache, reading data for the read address from the DRAM cache.

In another aspect, a DRAM cache management circuit is provided. The DRAM cache management circuit comprises a means for receiving a memory read request comprising a read address. The DRAM cache management circuit further comprises a means for determining whether the read address is found in a DRAM cache indicator cache of the DRAM cache management circuit. The DRAM cache management circuit also comprises a means for reading data at the read address in a system memory DRAM, responsive to determining that the read address is not found in the DRAM cache indicator cache. The DRAM cache management circuit additionally comprises a means for determining, based on the DRAM cache indicator cache, whether the read address is found in a DRAM cache that is part of a high-bandwidth memory, responsive to determining that the read address is found in the DRAM cache indicator cache. The DRAM cache management circuit further comprises a means for reading data at the read address in the system memory DRAM, responsive to determining that the read address is not found in the DRAM cache. The DRAM cache management circuit also comprises a means for reading data for the read address from the DRAM cache, responsive to determining that the read address is found in the DRAM cache.

In another aspect, a non-transitory computer-readable medium is provided, having stored thereon computer-executable instructions. When executed by a processor, the computer-executable instructions cause the processor to receive a memory read request comprising a read address. The computer-executable instructions further cause the processor to determine whether the read address is found in a DRAM cache indicator cache of a DRAM cache management circuit. The computer-executable instructions also cause the processor to, responsive to determining that the read address is not found in the DRAM cache indicator cache, read data at the read address in a system memory DRAM. The computer-executable instructions additionally cause the processor to, responsive to determining that the read address is found in the DRAM cache indicator cache, determine, based on the DRAM cache indicator cache, whether the read address is found in a DRAM cache that is part of a high-bandwidth memory. The computer-executable instructions further cause the processor to, responsive to determining that the read address is not found in the DRAM cache, read data at the read address in the system memory DRAM. The computer-executable instructions also cause the processor to, responsive to determining that the read address is found in the DRAM cache, read data for the read address from the DRAM cache.

DETAILED DESCRIPTION

Figure 1:
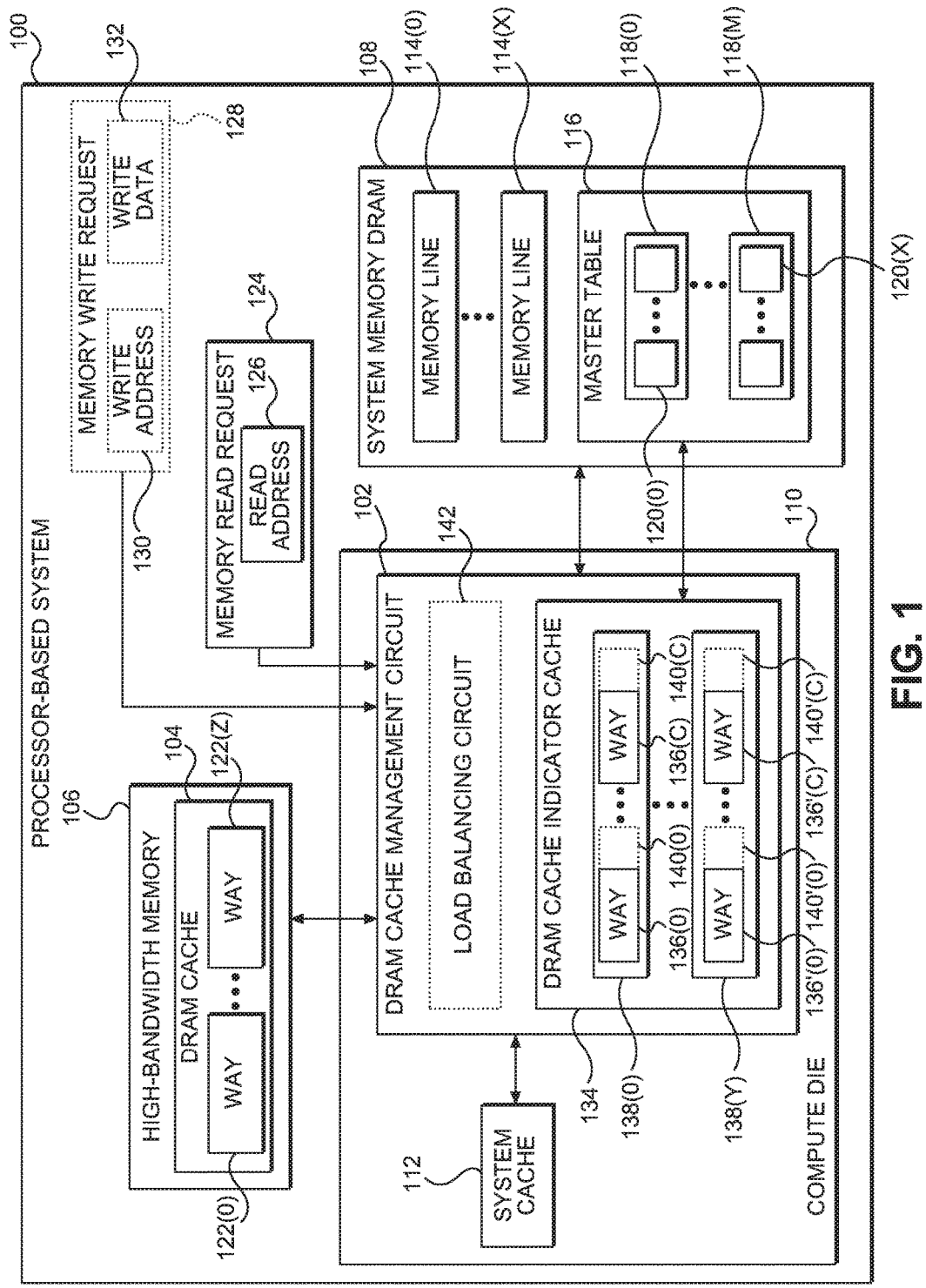
FIG. 1 is a block diagram of a processor-based system including a high-bandwidth memory providing a dynamic random access memory (DRAM) cache, and an exemplary DRAM cache management circuit for providing scalable DRAM cache management using a DRAM cache indicator cache.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include providing scalable dynamic random access memory (DRAM) cache management using DRAM cache indicator caches. As described herein, a DRAM cache management scheme is "scalable" in the sense that the size of the resources utilized by the DRAM cache management scheme is relatively independent of the capacity of the DRAM cache being managed. Accordingly, in this regard, FIG. 1 is a block diagram of an exemplary processor-based system 100 that provides a DRAM cache management circuit 102 for managing a DRAM cache 104 that is part of a high-bandwidth memory 106. The processor-based system 100 includes a system memory DRAM 108, which, in some aspects, may comprise one or more dual in-line memory modules (DIMMs) (not shown). The processor-based system 100 further provides a compute die 110, on which a system cache 112 (such as a Level 3 (L3) cache, as a non-limiting example) is located. The processor-based system 100 may encompass any one of known digital logic elements, semiconductor circuits, processing cores, and/or memory structures, among other elements, or combinations thereof. Aspects described herein are not restricted to any particular arrangement of elements, and the disclosed techniques may be easily extended to various structures and layouts on semiconductor dies or packages. It is to be understood that some aspects of the processor-based system 100 may include elements in addition to those illustrated in FIG. 1.

To improve memory bandwidth, the DRAM cache 104 within the high-bandwidth memory 106 of the processor-based system 100 may be used to cache memory addresses (not shown) and data (not shown) that were previously read from memory lines 114(0)-114(X) within the system memory DRAM 108, and/or evicted from the system cache 112. As non-limiting examples, some aspects may provide that data may be cached in the DRAM cache 104 only upon reading the data from the system memory DRAM 108, while in some aspects data may be cached in the DRAM cache 104 only when evicted from the system cache 112. According to some aspects, data may be cached in the DRAM cache 104 upon reading data from the system memory DRAM 108 for reads triggered by processor loads and dirty evictions from the system cache 112.

The DRAM cache 104 within the high-bandwidth memory 106 may be accessed independently of and in parallel with the system memory DRAM 108. As a result, memory bandwidth may be effectively increased by reading from both the DRAM cache 104 and the system memory DRAM 108 at the same time. In some aspects, the DRAM cache 104 may implement a random replacement policy to determine candidates for eviction within the DRAM cache 104.

A master table 116 stored in the system memory DRAM 108 is used to track which memory lines 114(0)-114(X) of the system memory DRAM 108 are stored in the DRAM cache 104. It is to be understood that, as used herein, a "memory line" of the system memory DRAM 108 refers to a portion of the system memory DRAM 108 having a length equal to a length of a cache line (not shown) of the system cache 112. The master table 116 contains master table entries 118(0)-118(M) for storing DRAM cache indicators 120(0)-120(X) for each of the memory lines 114(0)-114(X) of the system memory DRAM 108. Some aspects may provide that the size of each of the master table entries 118(0)-118(M) corresponds to a memory access granularity of the underlying memory. As a non-limiting example, for a memory access granularity of 64 bytes, each of the master table entries 118(0)-118(M) likewise comprises 64 bytes. Thus, in aspects in which each of the DRAM cache indicators 120(0)-120(X) comprises four (4) bits, each of the 64-byte master table entries 118(0)-118(M) of the master table 116 can store DRAM cache indicators 120(0)-120(X) for 128 memory lines 114(0)-114(X) of the system memory DRAM 108.

In some aspects, each of the DRAM cache indicators 120(0)-120(X) in the master table 116 indicates not only whether a corresponding memory line 114(0)-114(X) of the system memory DRAM 108 is stored in the DRAM cache 104 of the high-bandwidth memory 106, but also in which way 122(0)-122(Z) of the DRAM cache 104 the corresponding memory line 114(0)-114(X) is stored. For example, in some aspects, each of the DRAM cache indicators 120(0)-120(X) comprises four (4) bits, and the DRAM cache 104 may provide 15 ways 122(0)-122(14) (i.e., $2^4$-1). A DRAM cache indicator 120(0)-120(X) having a value of zero (0) indicates that the corresponding memory line 114(0)-114(X) of the system memory DRAM 108 is not stored in the DRAM cache 104. A DRAM cache indicator 120(0)-120(X) having a value N that is greater than zero (0) indicates that the corresponding memory line 114(0)-114(X) of the system memory DRAM 108 is stored in the DRAM cache 104 in way 122(N−1), where 0≤N−1≤Z.

It is to be understood that, in some aspects, the master table entries 118(0)-118(M) of the master table 116 may provide DRAM cache indicators 120(0)-120(X) that are larger or smaller than four (4) bits according to the number of ways 122(0)-122(Z) provided by the DRAM cache 104. As a non-limiting example, for a number Q of bits in each DRAM cache indicator 120(0)-120(X), the DRAM cache 104 may provide a number of ways 122(0)-122(Z) where $Z=2^Q-1$. Thus, a DRAM cache indicator 120(0)-120(X) comprising two (2) bits corresponds to a DRAM cache 104 that is organized into three (3) ways 122(0)-122(2), while a DRAM cache indicator 120(0)-120(X) comprising three (3) bits corresponds to a DRAM cache 104 providing seven (7) ways 122(0)-122(6). Different configurations of the DRAM cache indicators 120(0)-120(X) and the DRAM cache 104 are discussed in greater detail below with respect to FIGS. 2A and 2B.

Because the master table entries 118(0)-118(M) of the master table 116 store DRAM cache indicators 120(0)-120(X) for every memory line 114(0)-114(X) in the system memory DRAM 108, the size of the master table 116 increases as the size of the system memory DRAM 108 increases. For example, in aspects in which the DRAM cache indicators 120(0)-120(X) within the master table 116 are four (4) bits each, the total size of the master table 116 is 0.4% of the size of the system memory DRAM 108. Consequently, accessing the master table 116 for each memory operation may incur latency penalties that could offset the performance benefits of using the DRAM cache 104. Thus, it is desirable to provide a scalable mechanism for managing access to the DRAM cache 104 to improve memory bandwidth while minimizing latency penalties.

In this regard, the DRAM cache management circuit 102 is provided to manage access to the DRAM cache 104. The DRAM cache management circuit 102 is located on the compute die 110, and is communicatively coupled to the high-bandwidth memory 106 and the system memory DRAM 108. The DRAM cache management circuit 102 may also be read from and written to by the system cache 112. As discussed in greater detail below, the DRAM cache management circuit 102 may perform a memory read operation in response to receiving a memory read request 124 comprising a read address 126 specifying a memory address from which to retrieve data. In some aspects, the DRAM cache management circuit 102 may further perform a memory write operation in response to receiving a memory write request 128 comprising a write address 130 to which write data 132 is to be written.

To reduce access latency that may result from accesses to the master table 116, the DRAM cache management circuit 102 provides a DRAM cache indicator cache 134. The DRAM cache indicator cache 134 is used by the DRAM cache management circuit 102 to cache frequently accessed master table entries 118(0)-118(M) (and the DRAM cache indicators 120(0)-120(X) stored therein) within ways 136(0)-136(C), 136'(0)-136'(C) of DRAM cache indicator cache lines 138(0)-138(Y). In some aspects, the size of each of the ways 136(0)-136(C), 136'(0)-136'(C) of the DRAM cache indicator cache 134 corresponds to the size of the master table entries 118(0)-118(M) in the master table 116. Some aspects may provide that the size of each of the ways 136(0)-136(C), 136'(0)-136'(C) of the DRAM cache indicator cache 134 may be larger than the size of the master table entries 118(0)-118(M) in the master table 116. As a non-limiting example, the ways 136(0)-136(C), 136'(0)-136'(C) of the DRAM cache indicator cache 134 may include dirty indicators 140(0)-140(C), 140'(0)-140'(C), which add one (1) bit per way 136(0)-136(C), 136'(0)-136'(C). Thus, in aspects in which the ways 136(0)-136(C), 136'(0)-136'(C) are 64 bytes in size with four (4) bits per DRAM cache indicator 120(0)-120(X), a total of 128 extra bits may be required to provide the dirty indicators 140(0)-140(C), 140'(0)-140'(C).

Some aspects of the DRAM cache management circuit 102 may further provide a load balancing circuit 142 to improve memory bandwidth and reduce memory access contention. In circumstances in which a requested memory address can be read from either the system memory DRAM 108 or the DRAM cache 104, the load balancing circuit 142 identifies the most appropriate source from which to read the memory address. For example, in some aspects, the load balancing circuit 142 may monitor latencies of reads from the DRAM cache 104 and the system memory DRAM 108, and may select the source having a better average latency in the recent past. In this manner, the load balancing circuit 142 may distribute memory accesses between the system memory DRAM 108 and the DRAM cache 104 to optimize the use of system resources.

In some aspects, the DRAM cache management circuit 102 may be implemented as a "write-through" cache management system. In a write-through implementation, dirty (i.e., modified) data evicted from the system cache 112 is written by the DRAM cache management circuit 102 to both the DRAM cache 104 of the high-bandwidth memory 106 and the system memory DRAM 108. As a result, the data within the DRAM cache 104 and the data within the system memory DRAM 108 are always synchronized. Because both the DRAM cache 104 and the system memory DRAM 108 in a write-through implementation are guaranteed to contain correct data, the load balancing circuit 142 of the DRAM cache management circuit 102 may freely load-balance memory read operations between the DRAM cache 104 and the system memory DRAM 108. However, the write-through implementation of the DRAM cache management circuit 102 may not result in decreased write bandwidth to the system memory DRAM 108, because each write to the DRAM cache 104 will correspond to a write to the system memory DRAM 108.

Some aspects of the DRAM cache management circuit 102 may be implemented as a "write-back" cache management system, in which the DRAM cache indicator cache 134 of the DRAM cache management circuit 102 includes the dirty indicators 140(0)-140(C), 140'(0)-140'(C) for each way 136(0)-136(C), 136'(0)-136'(C) therein. Each of the dirty indicators 140(0)-140(C), 140'(0)-140'(C) indicates whether data stored in the DRAM cache 104 corresponding to the way 136(0)-136(C), 136'(0)-136'(C) within the DRAM cache indicator cache 134 is dirty (i.e., whether the data was written to the DRAM cache 104 but not to the system memory DRAM 108). If the data is not dirty, the data may be read from either the DRAM cache 104 or the system memory DRAM 108, as determined by the load balancing circuit 142 of the DRAM cache management circuit 102. However, if the dirty indicator 140(0)-140(C), 140'(0)-140'(C) indicates that the data stored in the DRAM cache 104 is dirty, load balancing is not possible, as the DRAM cache 104 is the only source for the modified data. Accordingly, the DRAM cache management circuit 102 reads the dirty data from the DRAM cache 104.

The write-back implementation of the DRAM cache management circuit 102 may reduce memory write bandwidth consumption to the system memory DRAM 108, but the DRAM cache management circuit 102 eventually must write back dirty data evicted from the DRAM cache 104 to the system memory DRAM 108. In some aspects of the write-back implementation of the DRAM cache management circuit 102, when a DRAM cache indicator cache line 138(0)-138(Y) is evicted from the DRAM cache indicator cache 134, the DRAM cache management circuit 102 is configured to copy all dirty data in the DRAM cache 104 corresponding to the evicted DRAM cache indicator cache line 138(0)-138(Y) to the system memory DRAM 108.

Some aspects of the DRAM cache management circuit 102 may further improve memory bandwidth by performing some operations (e.g., operations involving memory accesses to the system memory DRAM 108 and/or the DRAM cache 104, as non-limiting examples) according to corresponding probabilistic determinations made by the DRAM cache management circuit 102. Each probabilistic determination may be used to tune the frequency of the corresponding operation, and may be stateless (i.e., not related to the outcome of previous probabilistic determinations). For example, according to some aspects of the DRAM cache management circuit 102, data evicted by the system cache 112 may be written to the DRAM cache 104 based on a probabilistic determination, such that only a percentage of randomly-selected data evicted by the system cache 112 is written to the DRAM cache 104. Similarly, some aspects of the DRAM cache management circuit 102 may be configured to replenish the DRAM cache indicator cache 134 (e.g., by copying a master table entry 118(0)-118(M) for the read data from the master table 116 to the DRAM cache indicator cache 134) based on a probabilistic determination. Thus, it is to be understood that each operation described herein as occurring "probabilistically" may or may not be performed in a given instance, and further that the occurrence or lack thereof of a given probabilistic operation may further trigger additional operations by the DRAM cache management circuit 102.

Figure 2A:
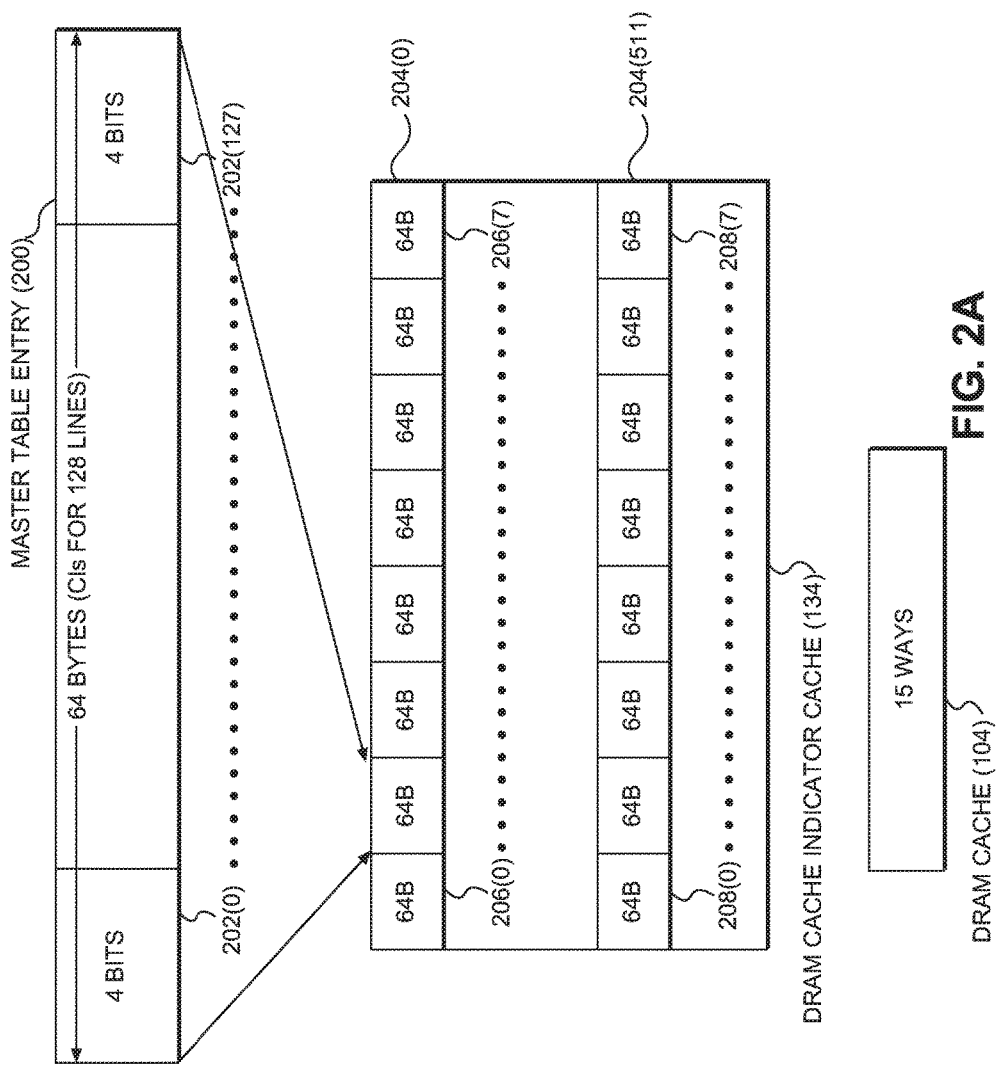
FIGS. 2A-2B are block diagrams illustrating exemplary master table entries and DRAM cache indicator cache contents for two exemplary DRAM caches that may be managed by the DRAM cache management circuit of FIG. 1.
Figure 2B:
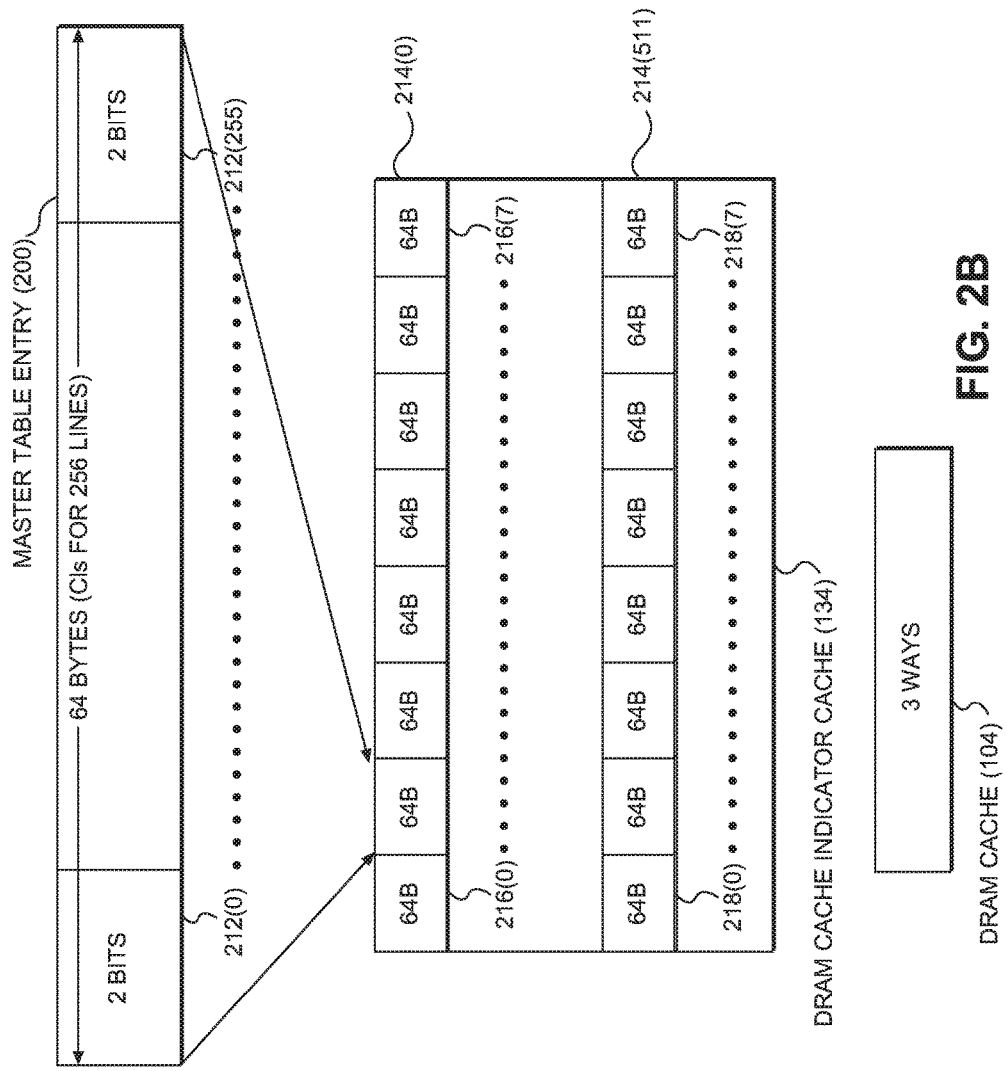

To illustrate exemplary master table entries 118(0)-118(M) and DRAM cache indicator 120(0)-120(X) contents for some implementations of the DRAM cache 104 of FIG. 1, FIGS. 2A-2B are provided. FIG. 2A illustrates an implementation of the DRAM cache 104 comprising 15 ways, while FIG. 2B illustrates an implementation of the DRAM cache 104 comprising three (3) ways. For the sake of clarity, elements of FIG. 1 are referenced in describing FIGS. 2A and 2B.

In FIG. 2A, an exemplary master table entry 200 (which may correspond to one of the master table entries 118(0)-118(M) of FIG. 1) having a size of 64 bytes is illustrated. The master table entry 200 includes DRAM cache indicators 202(0)-202 (127) (corresponding to the DRAM cache indicators 120(0)-120(X) of FIG. 1), each of which is four (4) bits in size. Accordingly, the master table entry 200 stores the DRAM cache indicators 202(0)-202(127) for 128 memory lines 114(0)-114(X) of the system memory DRAM 108. To cache the DRAM cache indicators 202(0)-202(127), the DRAM cache indicator cache 134 provides DRAM cache indicator cache lines 204(0)-204(511) (corresponding to the DRAM cache indicator cache lines 138(0)-138 (Y) of FIG. 1). Each of the DRAM cache indicator cache lines 204(0)-204(511) is made up of eight (8) ways, such as ways 206(0)-206(7), 208(0)-208(7) of the DRAM cache indicator cache lines 204(0), 204(511), respectively. Each of the ways 206(0)-206 (7), 208(0)-208(7) corresponds to the ways 136(0)-136(C), 136'(0)-136'(C) of FIG. 1, and may store one (1) master table entry, such as the master table entry 200.

Referring now to FIG. 2B, a master table entry 210 of 64 bytes is shown. In the example of FIG. 2B, the master table entry 210 includes DRAM cache indicators 212(0)-212 (255), each of which is two (2) bits in size. Accordingly, the master table entry 210 stores the DRAM cache indicators 212(0)-212(255) for 256 memory lines of the system memory DRAM 108. The DRAM cache indicator cache 134 in this example provides DRAM cache indicator cache lines 214(0)-214(511) to cache the DRAM cache indicators 212 (0)-212(255). Each of the DRAM cache indicator cache lines 214(0)-214(511) is made up of eight (8) ways, such as ways 216(0)-216(7), 218(0)-218(7) of the DRAM cache indicator cache lines 214(0), 214(511), respectively. Each of the ways 216(0)-216(7), 218(0)-218(7) may store one (1) master table entry, such as the master table entry 210.

Figure 3:
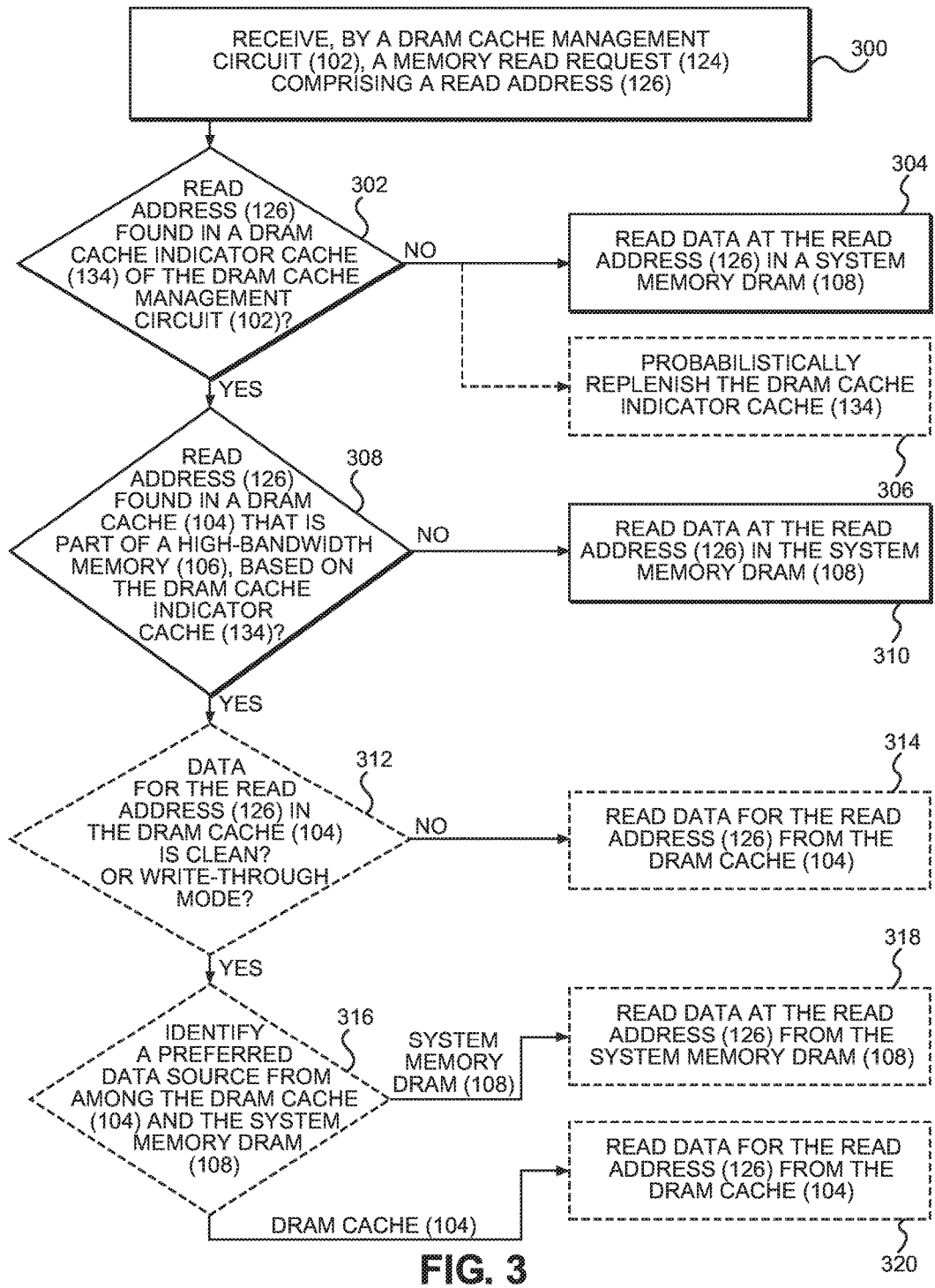
FIG. 3 is a flowchart illustrating exemplary operations of the DRAM cache management circuit of FIG. 1 for performing a read operation using the DRAM cache indicator cache and the DRAM cache of FIG. 1.

FIG. 3 is a flowchart illustrating exemplary operations of the DRAM cache management circuit 102 of FIG. 1 for performing a read operation using the DRAM cache indicator cache 134 and the DRAM cache 104 of FIG. 1. Elements of FIG. 1 are referenced in describing FIG. 3 for the sake of clarity. In FIG. 3, operations begin with the DRAM cache management circuit 102 receiving the memory read request 124 comprising the read address 126 (e.g., as a result of a miss on the system cache 112) (block 300). Accordingly, the DRAM cache management circuit 102 may be referred to herein as "a means for receiving a memory read request comprising a read address." The DRAM cache management circuit 102 determines whether the read address 126 is found in the DRAM cache indicator cache 134 of the DRAM cache management circuit 102 (block 302). The DRAM cache management circuit 102 may thus be referred to herein as "a means for determining whether the read address is found in a DRAM cache indicator cache of the DRAM cache management circuit."

If the read address 126 of the memory read request 124 is not found in the DRAM cache indicator cache 134, the DRAM cache management circuit 102 reads data at the read address 126 in the system memory DRAM 108 (block 304). In this regard, the DRAM cache management circuit 102 may be referred to herein as "a means for reading data at the read address in a system memory DRAM, responsive to determining that the read address is not found in the DRAM cache indicator cache." In parallel with reading the data at the read address 126, some aspects of the DRAM cache management circuit 102 may probabilistically replenish the DRAM cache indicator cache 134 (block 306). By replenishing the DRAM cache indicator cache 134, the likelihood that subsequent reads (which may be spatially adjacent to the read data) will result in a DRAM cache indicator cache 134 hit may be increased.

Probabilistically replenishing the DRAM cache indicator cache 134 in some aspects may include copying a master table entry 118(0)-118(M) for the read data from the master table 116 to the DRAM cache indicator cache 134, as a non-limiting example. Some aspects may provide that operations of block 306 for replenishing the DRAM cache indicator cache 134 may include reading a master table entry 118(0)-118 (M) spanning the read address 126 from the master table 116 in the system memory DRAM 108. The master table entry 118(0)-118(M) is then installed in the DRAM cache indicator cache 134. If the installation of the master table entry 118(0)-118(M) causes an eviction of one of the ways 136(0)-136(C), 136'(0)-136'(C) from the DRAM cache indicator cache 134, the contents of the evicted way 136(0)-136(C), 136'(0)-136'(C) (without any dirty indicators 140(0)-140(C), 140'(0)-140'(C) that may be present) are written to the master table 116 in the system memory DRAM 108. In aspects in which the DRAM cache management circuit 102 is configured to operate in a write-back mode, any dirty DRAM cache lines indicated by the evicted way 136(0)-136 (C), 136'(0)-136'(C) are also copied from the DRAM cache 104 to the system memory DRAM 108.

If the DRAM cache management circuit 102 determines at decision block 302 that the read address 126 is found in the DRAM cache indicator cache 134, the DRAM cache management circuit 102 next determines whether the read address 126 is found in the DRAM cache 104 that is part of the high-bandwidth memory 106, based on the DRAM cache indicator cache 134 (block 308). Accordingly, the DRAM cache management circuit 102 may be referred to herein as "a means for determining, based on the DRAM cache indicator cache, whether the read address is found in a DRAM cache that is part of a high-bandwidth memory, responsive to determining that the read address is found in the DRAM cache indicator cache." In some aspects, determining whether the read address 126 is found in the DRAM cache 104 may include determining if the way number for the read address 126 in the DRAM cache indicator cache 134 is non-zero. If so, the read address 126 is in the DRAM cache 104. Otherwise, if the way number for the read address 126 in the DRAM cache indicator cache 134 is zero (0), the read address 126 is not in the DRAM cache 104.

If the read address 126 is not found in the DRAM cache 104, the DRAM cache management circuit 102 reads data at the read address 126 in the system memory DRAM 108 (block 310). The DRAM cache management circuit 102 thus may be referred to herein as "a means for reading data at the read address in the system memory DRAM, responsive to determining that the read address is not found in the DRAM cache." However, if the DRAM cache management circuit 102 determines at decision block 308 that the read address 126 is found in the DRAM cache 104, the DRAM cache management circuit 102 in some aspects determines whether the data for the read address 126 in the DRAM cache 104 is clean (or, alternatively, whether the DRAM cache management circuit 102 is configured to operate in a write-through mode) (block 312). If the data in the DRAM cache 104 is not clean and/or the DRAM cache management circuit 102 is not operating in a write-through mode, the requested data can only be read safely from the DRAM cache 104. Accordingly, the DRAM cache management circuit 102 reads the data for the read address 126 from the DRAM cache 104 (block 314). In this regard, the DRAM cache management circuit 102 may be referred to herein as "a means for reading data for the read address from the DRAM cache, responsive to determining that the read address is found in the DRAM cache."

If the DRAM cache management circuit 102 determines at decision block 312 that the data in the DRAM cache 104 is clean and/or the DRAM cache management circuit 102 is operating in a write-through mode, the requested data can be read safely from either the system memory DRAM 108 or the DRAM cache 104. Accordingly, the load balancing circuit 142 of the DRAM cache management circuit 102 identifies a preferred data source from among the DRAM cache 104 and the system memory DRAM 108 based on load balancing criteria such as bandwidth and latency, as non-limiting examples (block 316). If the load balancing circuit 142 determines that the system memory DRAM 108 is the preferred data source, the data at the read address 126 may be read from the system memory DRAM 108 (block 318). Similarly, if the load balancing circuit 142 determines that the DRAM cache 104 is the preferred data source, the data for the read address 126 may be read from the DRAM cache 104 (block 320).

Figure 4A:
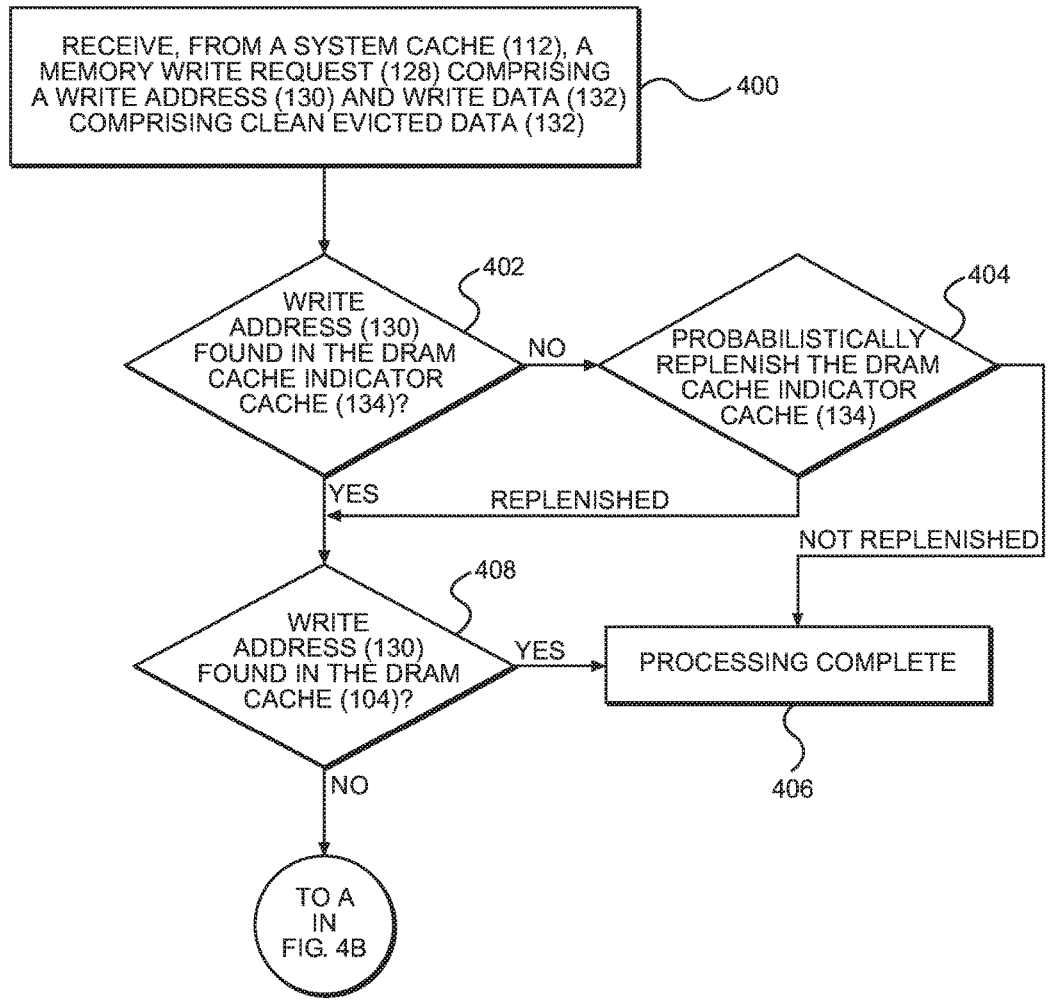
FIGS. 4A-4C are flowcharts illustrating exemplary operations of the DRAM cache management circuit of FIG. 1 for performing a write operation resulting from an eviction of "clean" (i.e., unmodified) data from a Level 3 (L3) cache in a write-through mode or a write-back mode.
Figure 4B:
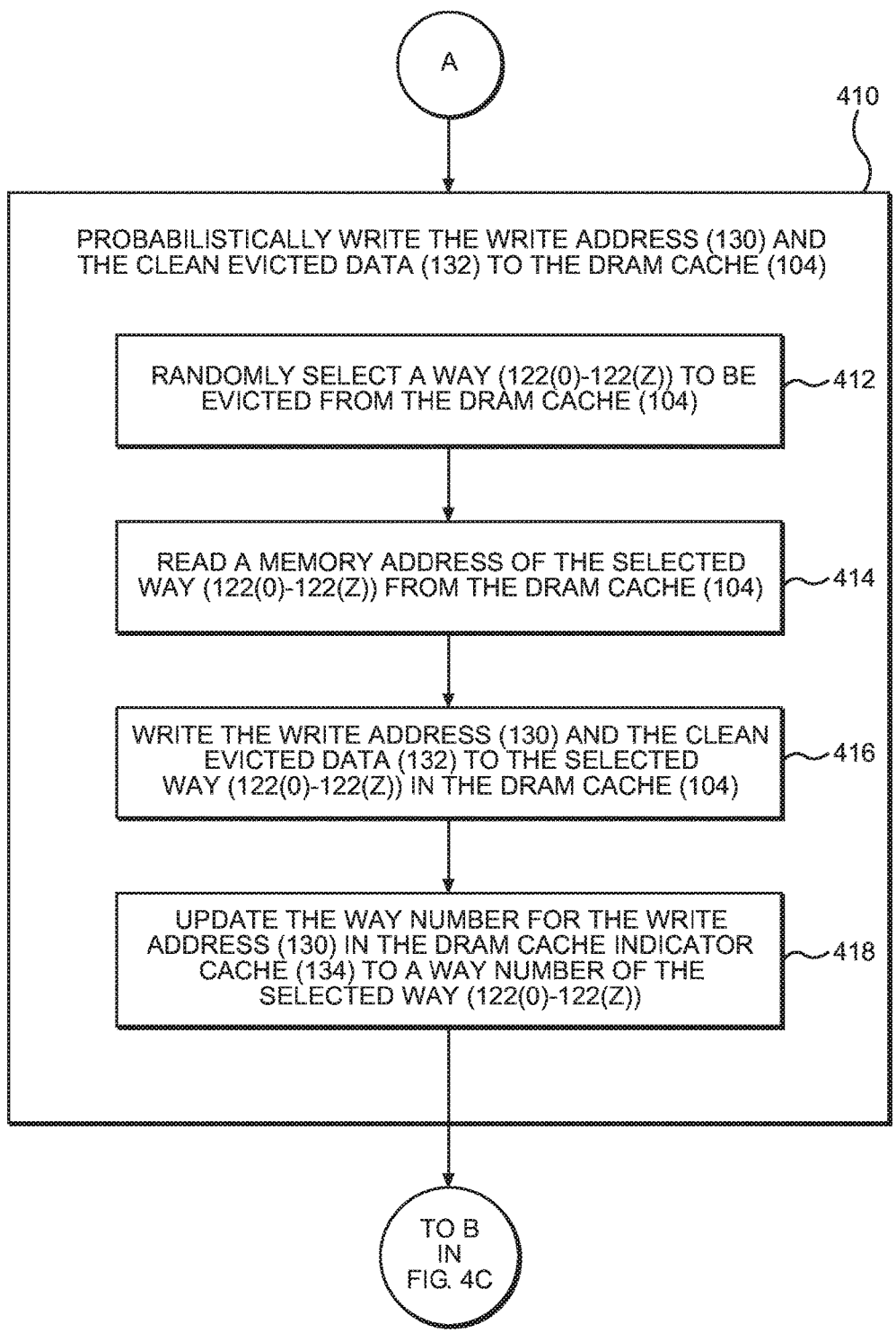
Figure 4C:
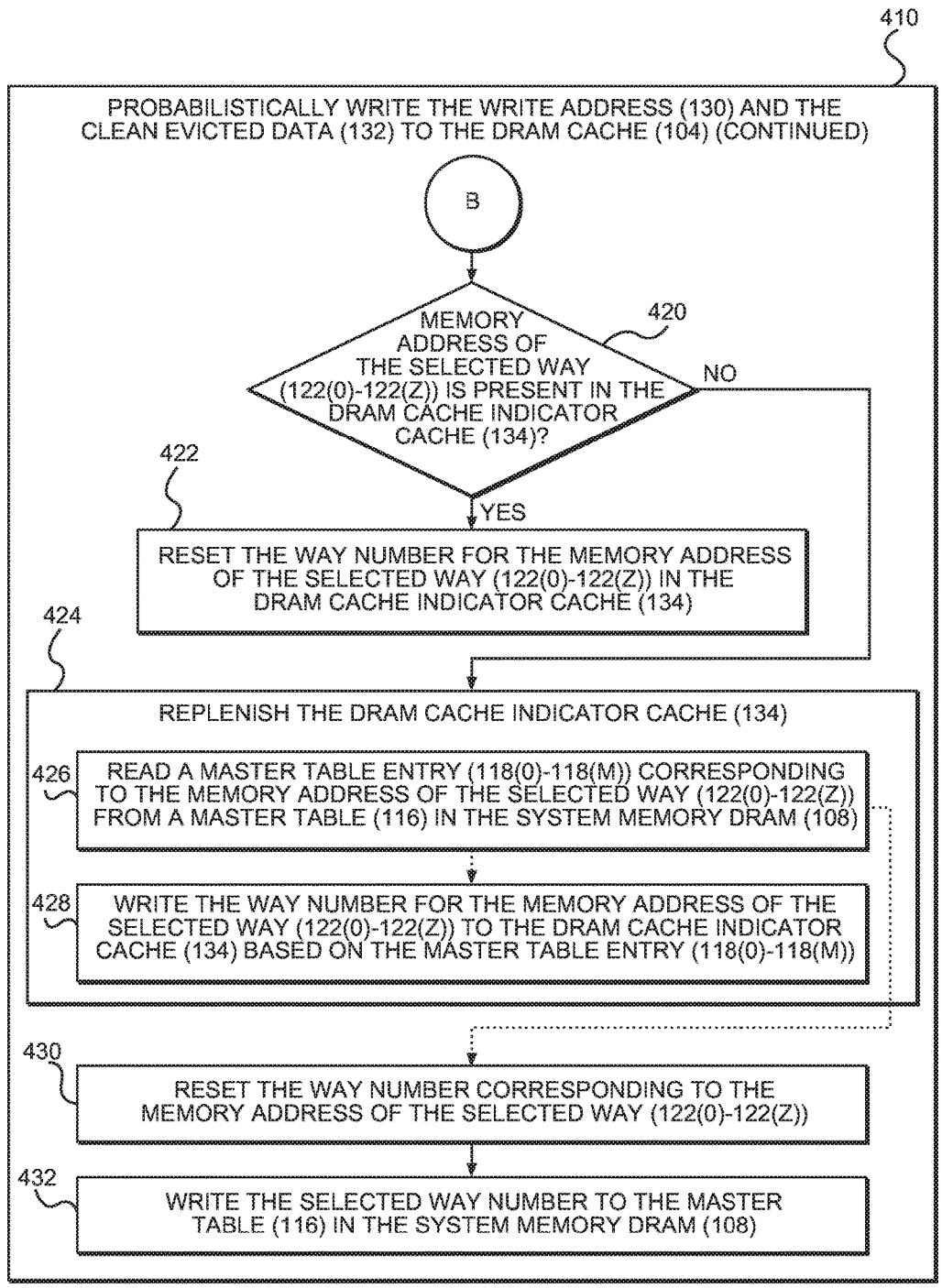

To illustrate exemplary operations of the DRAM cache management circuit 102 of FIG. 1 for performing a write operation resulting from an eviction of clean (i.e., unmodified) data from the system cache 112 in a write-through mode or a write-back mode, FIGS. 4A-4C are provided. For the sake of clarity, elements of FIG. 1 are referenced in describing FIGS. 4A-4C. Operations in FIG. 4A begin with the DRAM cache management circuit 102 receiving the memory write request 128 comprising the write address 130 and the write data 132 (block 400). In this example, the write data 132 represents clean (i.e., unmodified) data evicted from the system cache 112, and thus is referred to herein as "clean evicted data 132."

The DRAM cache management circuit 102 determines whether the write address 130 of the clean evicted data 132 is found in the DRAM cache indicator cache 134 (block 402). If the write address 130 is not present in the DRAM cache indicator cache 134, the DRAM cache management circuit 102 probabilistically replenishes the DRAM cache indicator cache 134 (e.g., by copying a master table entry 118(0)-118(M) from the master table 116 to the DRAM cache indicator cache 134) (block 404). If the DRAM cache indicator cache 134 is not replenished at block 404 (i.e., replenishment was probabilistically determined not to occur), processing is complete (block 406). Otherwise, the DRAM cache management circuit 102 resumes processing at block 408.

If the DRAM cache management circuit 102 determines at decision block 402 that the write address 130 of the clean evicted data 132 is present in the DRAM cache indicator cache 134 (or if the DRAM cache indicator cache 134 is replenished at block 404), the DRAM cache management circuit 102 next determines whether the write address 130 of the clean evicted data 132 is present in the DRAM cache 104 (block 408). If the write address 130 is present in the DRAM cache 104, processing is complete (block 406). However, if the write address 130 of the clean evicted data 132 is not present in the DRAM cache 104, processing resumes at block 410 of FIG. 4B.

Referring now to FIG. 4B, the DRAM cache management circuit 102 next probabilistically writes the write address 130 and the clean evicted data 132 to the DRAM cache 104 (block 410). In some aspects, operations of block 410 for writing the write address 130 and the clean evicted data 132 to the DRAM cache 104 may include first randomly selecting a way 122(0)-122(Z) to be evicted from the DRAM cache 104 (block 412). The DRAM cache management circuit 102 reads a memory address of the selected way 122(0)-122(Z) from the DRAM cache 104 (block 414). The DRAM cache management circuit 102 then writes the write address 130 and the clean evicted data 132 to the selected way 122(0)-122(Z) in the DRAM cache 104 (block 416). The DRAM cache management circuit 102 updates the way number for the write address 130 in the DRAM cache indicator cache 134 to a way number of the selected way 122(0)-122(Z) (block 418). Processing then continues at block 420 of FIG. 4C.

Turning to FIG. 4C, further operations of block 410 for probabilistically writing the write address 130 and the clean evicted data 132 to the DRAM cache 104 include the DRAM cache management circuit 102 determining whether the memory address of the selected way 122(0)-122(Z) is present in the DRAM cache indicator cache 134 (block 420). If not, processing resumes at block 424 of FIG. 4C. If the DRAM cache management circuit 102 determines at decision block 420 that the memory address of the selected way 122(0)-122(Z) is present in the DRAM cache indicator cache 134, the DRAM cache management circuit 102 resets the way number of the selected way 122(0)-122(Z) for the memory address in the DRAM cache indicator cache 134 (block 422).

If the DRAM cache management circuit 102 determines at decision block 420 that the memory address of the selected way 122(0)-122(Z) is not present in the DRAM cache indicator cache 134, the DRAM cache management circuit 102 replenishes the DRAM cache indicator cache 134 (block 424). In some aspects, operations of block 424 for replenishing the DRAM cache indicator cache 134 include reading the master table entry 118(0)-118(M) of the selected way 122(0)-122(Z) corresponding to the memory address from the master table 116 in the system memory DRAM 108 (block 426). The DRAM cache management circuit 102 in some aspects may next write the way number of the selected way 122(0)-122(Z) for the memory address to the DRAM cache indicator cache 134 based on the master table entry 118(0)-118 (M) (block 428). In some aspects, the DRAM cache management circuit 102 resets the way number of the selected way 122(0)-122(Z) corresponding to the memory address (block 430). The DRAM cache management circuit 102 then writes the way number to the master table 116 in the system memory DRAM 108 (without installing the master table entry 118(0)-118(M) in the DRAM cache indicator cache 134) (block 432).

Figure 5A:
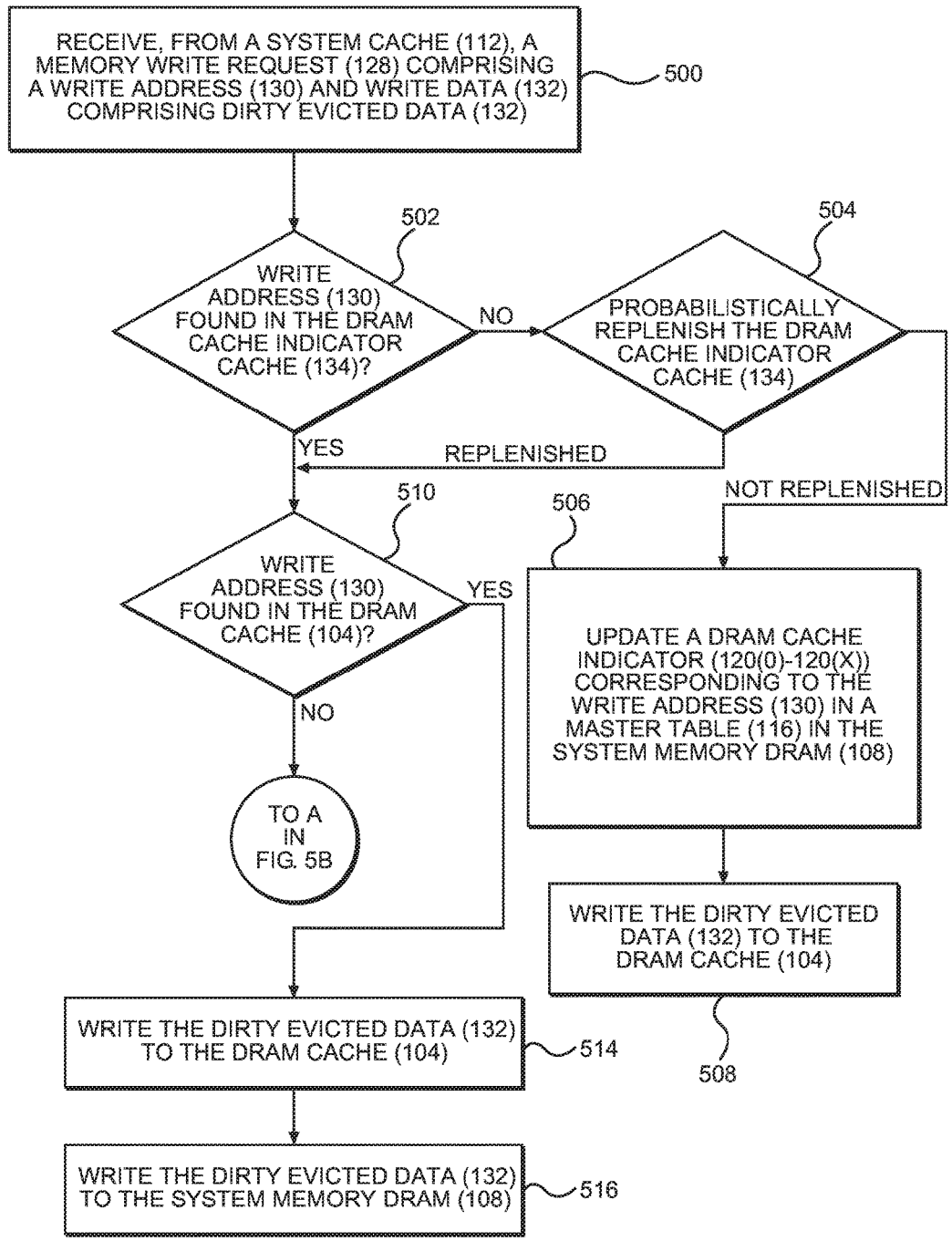
FIGS. 5A-5C are flowcharts illustrating exemplary operations of the DRAM cache management circuit of FIG. 1 for performing a write operation resulting from an eviction of "dirty" (i.e., modified) data from an L3 cache in a write-through mode.
Figure 5B:
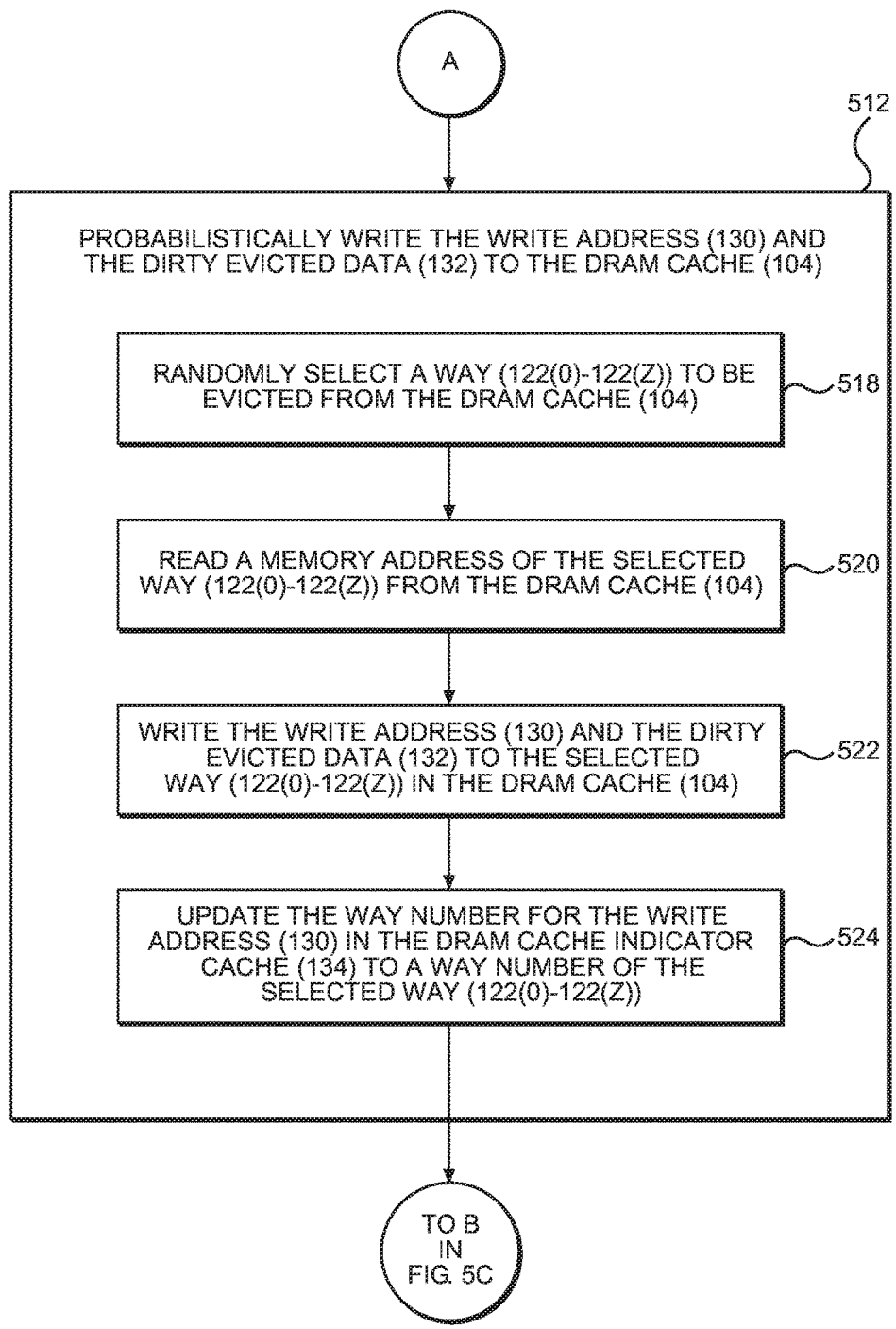
Figure 5C:
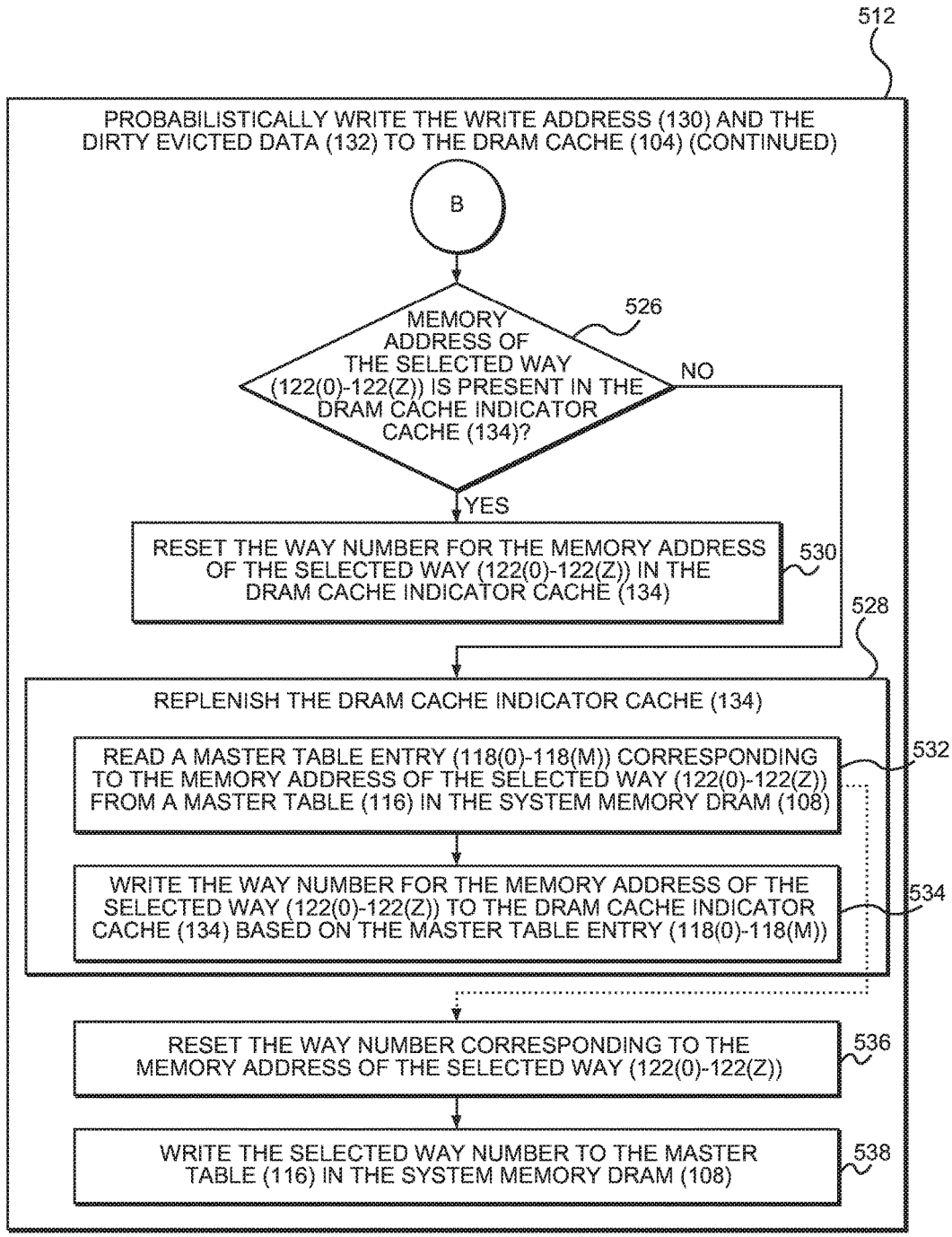

FIGS. 5A-5C are provided to illustrate exemplary operations of the DRAM cache management circuit 102 of FIG. 1 for performing a write operation resulting from an eviction of dirty data from the system cache 112 in a write-through mode. Elements of FIG. 1 are referenced in describing FIGS. 5A-5C for the sake of clarity. In FIG. 5A, operations begin with the DRAM cache management circuit 102 receiving the memory write request 128 comprising the write address 130 and the write data 132 (block 500). The write data 132 in the example of FIG. 5A represents dirty (i.e., modified) data evicted from the system cache 112, and as a result is referred to herein as "dirty evicted data 132."

The DRAM cache management circuit 102 determines whether the write address 130 of the dirty evicted data 132 is found in the DRAM cache indicator cache 134 (block 502). If the write address 130 is not present in the DRAM cache indicator cache 134, the DRAM cache management circuit 102 probabilistically replenishes the DRAM cache indicator cache 134 (by copying a master table entry 118(0)-118(M) from the master table 116 to the DRAM cache indicator cache 134, as a non-limiting example) (block 504). If the DRAM cache indicator cache 134 is replenished at block 504 (i.e., replenishment was probabilistically determined to occur), processing resumes at block 506. Otherwise, the DRAM cache management circuit 102 updates the DRAM cache indicator 120(0)-120(X) corresponding to the write address 130 in the master table 116 in the system memory DRAM 108 (e.g., by performing a read-modify-write (RMW) operation on the master table entry 118(0)-118(M) for the DRAM cache indicator 120(0)-120(X)) (block 508). The DRAM cache management circuit 102 then writes the dirty evicted data 132 to the DRAM cache 104 (block 510). It is to be understood that, in some aspects, operations of block 508 for updating the DRAM cache indicator 120(0)-120(X) and operations of block 510 for writing the dirty evicted data 132 to the DRAM cache 104 may be carried out in parallel.

If the DRAM cache management circuit 102 determines at decision block 502 that the write address 130 of the dirty evicted data 132 is found in the DRAM cache indicator cache 134 (or if the DRAM cache indicator cache 134 is replenished at block 504), the DRAM cache management circuit 102 next determines whether the write address 130 of the dirty evicted data 132 is found in the DRAM cache 104 (block 506). If the write address 130 is not found in the DRAM cache 104, processing resumes at block 512 of FIG. 5B. However, if the DRAM cache management circuit 102 determines at decision block 506 that the write address 130 is found in the DRAM cache 104, the DRAM cache management circuit 102 writes the dirty evicted data 132 to the DRAM cache 104 (e.g., by performing a no-evict-write to the DRAM cache 104) (block 514). The DRAM cache management circuit 102 then writes the dirty evicted data 132 to the system memory DRAM 108 (block 516).

Turning to FIG. 5B, the DRAM cache management circuit 102 next probabilistically writes the write address 130 and the dirty evicted data 132 to the DRAM cache 104 (block 512). Some aspects may provide that operations of block 512 for writing the write address 130 and the dirty evicted data 132 to the DRAM cache 104 may include first randomly selecting a way 122(0)-122(Z) to be evicted from the DRAM cache 104 (block 518). A memory address of the selected way 122(0)-122(Z) is read from the DRAM cache 104 by the DRAM cache management circuit 102 (block 520). The DRAM cache management circuit 102 then writes the write address 130 and the dirty evicted data 132 to the selected way 122(0)-122(Z) in the DRAM cache 104 (block 522). The DRAM cache management circuit 102 updates the way number for the write address 130 in the DRAM cache indicator cache 134 to a way number of the selected way 122(0)-122(Z) (block 524). Processing then continues at block 526 of FIG. 5C.

Referring now to FIG. 5C, further operations of block 512 for probabilistically writing the write address 130 and the dirty evicted data 132 to the DRAM cache 104 include the DRAM cache management circuit 102 determining whether a memory address of the selected way 122(0)-122(Z) is present in the DRAM cache indicator cache 134 (block 526). If not, processing resumes at block 528 of FIG. 5C. If the DRAM cache management circuit 102 determines at decision block 526 that the memory address of the selected way 122(0)-122(Z) is present in the DRAM cache indicator cache 134, the DRAM cache management circuit 102 resets the way number of the selected way 122(0)-122(Z) for the memory address in the DRAM cache indicator cache 134 (block 530).

If the DRAM cache management circuit 102 determines at decision block 526 that the memory address of the selected way 122(0)-122(Z) is not present in the DRAM cache indicator cache 134, the DRAM cache management circuit 102 replenishes the DRAM cache indicator cache 134 (block 528). In some aspects, operations of block 528 for replenishing the DRAM cache indicator cache 134 include reading the master table entry 118(0)-118(M) of the selected way 122(0)-122(Z) corresponding to the memory address from the master table 116 in the system memory DRAM 108 (block 532). The DRAM cache management circuit 102 in some aspects may next write the way number of the selected way 122(0)-122(Z) for the memory address to the DRAM cache indicator cache 134 based on the master table entry 118(0)-118 (M) (block 534). In some aspects, the DRAM cache management circuit 102 resets the way number of the selected way 122(0)-122(Z) corresponding to the memory address (block 536). The DRAM cache management circuit 102 then writes the way number to the master table 116 in the system memory DRAM 108 (without installing the master table entry 118(0)-118(M) in the DRAM cache indicator cache 134) (block 538).

Figure 6A:
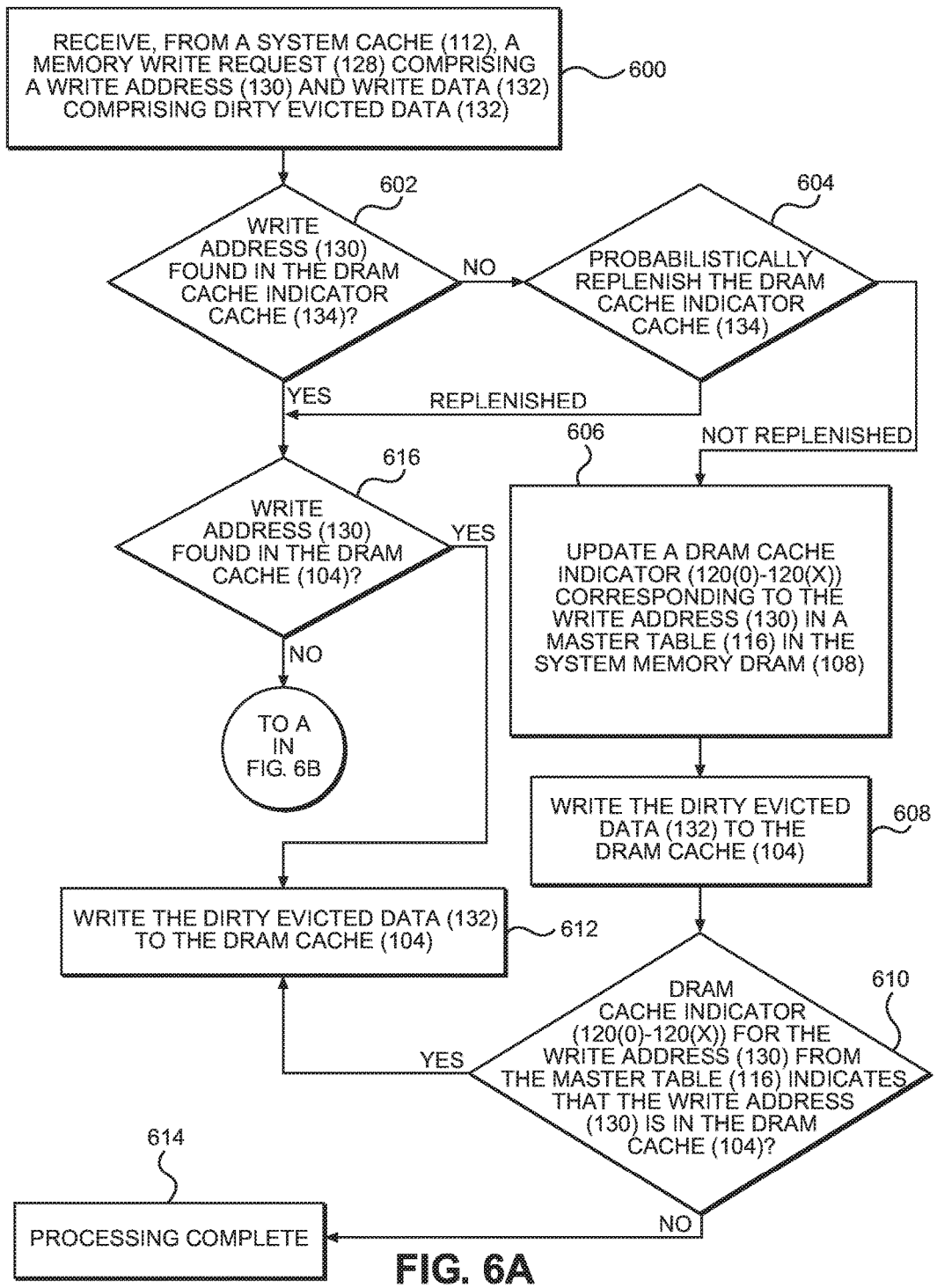
FIGS. 6A-6D are flowcharts illustrating exemplary operations of the DRAM cache management circuit of FIG. 1 for performing a write operation resulting from an eviction of dirty data from an L3 cache in a write-back mode.

To illustrate exemplary operations of the DRAM cache management circuit 102 of FIG. 1 for performing a write operation resulting from an eviction of dirty data from the system cache 112 in a write-back mode, FIGS. 6A-6D are provided. For the sake of clarity, elements of FIG. 1 are referenced in describing FIGS. 6A-6D. Operations in FIG. 6A begin with the DRAM cache management circuit 102 receiving the memory write request 128 comprising the write address 130 and the write data 132 (block 600). As with FIG. 5A, the write data 132 in the example of FIG. 6A represents dirty (i.e., modified) data evicted from the system cache 112, and as a result is referred to herein as "dirty evicted data 132."

The DRAM cache management circuit 102 determines whether the write address 130 of the dirty evicted data 132 is found in the DRAM cache indicator cache 134 (block 602). If the write address 130 is not present in the DRAM cache indicator cache 134, the DRAM cache management circuit 102 probabilistically replenishes the DRAM cache indicator cache 134 (e.g., by copying a master table entry 118(0)-118(M) from the master table 116 to the DRAM cache indicator cache 134) (block 604). If the DRAM cache indicator cache 134 is replenished at block 604 (i.e., replenishment was probabilistically determined to occur), processing resumes at block 606. Otherwise, the DRAM cache management circuit 102 updates the DRAM cache indicator 120(0)-120 (X) corresponding to the write address 130 in the master table 116 in the system memory DRAM 108 (e.g., by performing a read-modify-write (RMW) operation on the master table entry 118(0)-118(M) for the DRAM cache indicator 120(0)-120(X)) (block 608). The DRAM cache management circuit 102 then writes the dirty evicted data 132 to the DRAM cache 104 (block 610). It is to be understood that, in some aspects, operations of block 608 for updating the DRAM cache indicator 120(0)-120(X) and operations of block 610 for writing the dirty evicted data 132 to the DRAM cache 104 may be carried out in parallel.

Some aspects of the DRAM cache management circuit 102 may next determine whether the DRAM cache indicator 120(0)-120(X) for the write address 130 from the master table 116 indicates that the write address 130 is in the DRAM cache 104 (block 612). If not, processing is complete (block 614). However, if the DRAM cache management circuit 102 determines at decision block 612 that the DRAM cache indicator 120(0)-120(X) for the write address 130 from the master table 116 indicates that the write address 130 is in the DRAM cache 104, the DRAM cache management circuit 102 writes the dirty evicted data 132 to the DRAM cache 104 (block 616).

Referring back to decision block 602, if the DRAM cache management circuit 102 determines that the write address 130 of the dirty evicted data 132 is found in the DRAM cache indicator cache 134 (or if the DRAM cache indicator cache 134 is replenished at block 604), the DRAM cache management circuit 102 next determines whether the write address 130 of the dirty evicted data 132 is found in the DRAM cache 104 (block 606). If the write address 130 is not found in the DRAM cache 104, processing resumes at block 618 of FIG. 6B. However, if the DRAM cache management circuit 102 determines at decision block 606 that the write address 130 is found in the DRAM cache 104, the DRAM cache management circuit 102 writes the dirty evicted data 132 to the DRAM cache 104 (e.g., by performing a no-evict-write operation to the DRAM cache 104) (block 616).

Figure 6B:
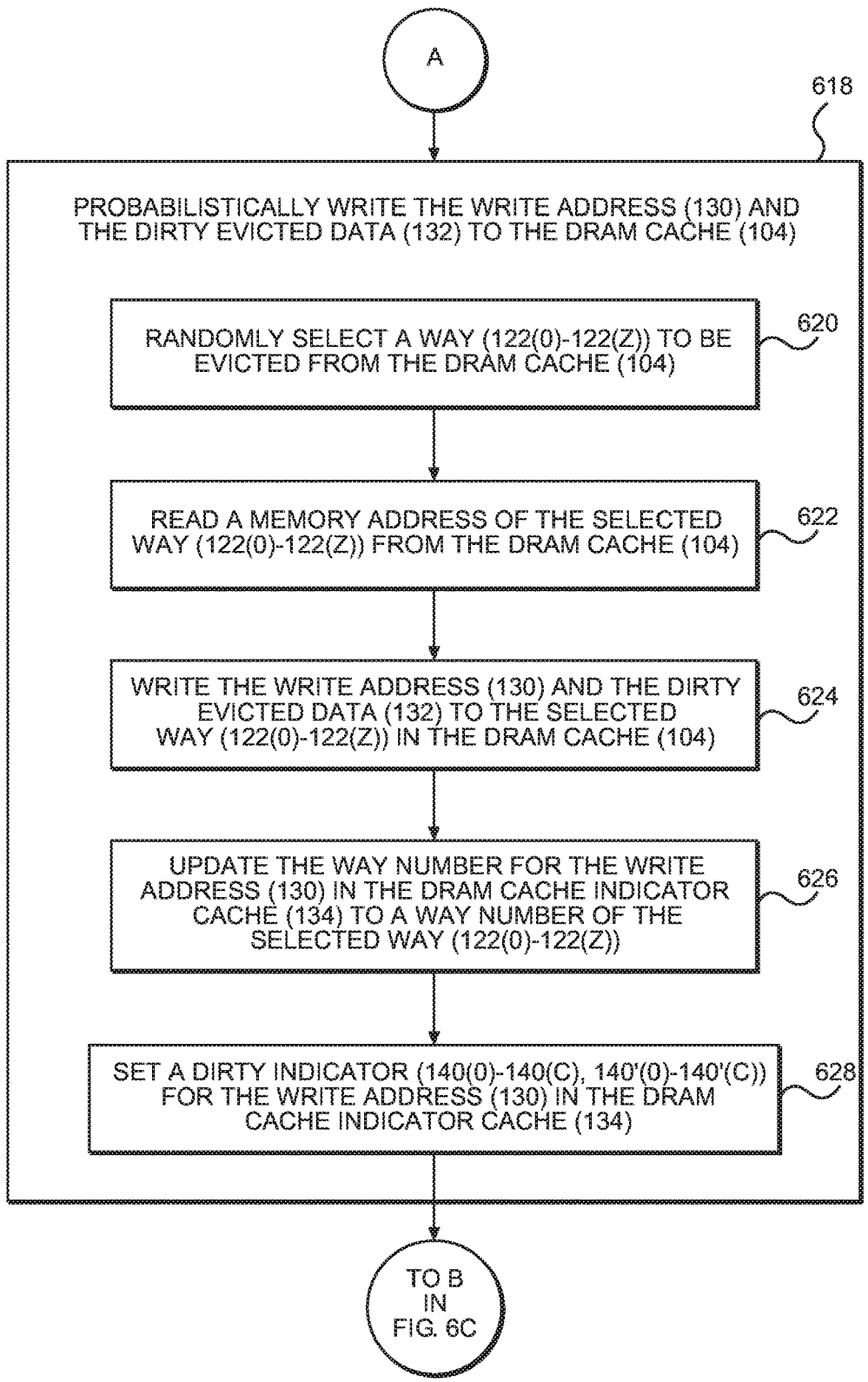

Turning now to FIG. 6B, the DRAM cache management circuit 102 next probabilistically writes the write address 130 and the dirty evicted data 132 to the DRAM cache 104 (block 618). According to some aspects, operations of block 618 for writing the write address 130 and the dirty evicted data 132 to the DRAM cache 104 may include first randomly selecting a way 122(0)-122(Z) to be evicted from the DRAM cache 104 (block 620). A memory address of the selected way 122(0)-122(Z) is read from the DRAM cache 104 by the DRAM cache management circuit 102 (block 622). The DRAM cache management circuit 102 then writes the write address 130 and the dirty evicted data 132 to the selected way 122(0)-122(Z) in the DRAM cache 104 (block 624). The DRAM cache management circuit 102 updates the way number for the write address 130 in the DRAM cache indicator cache 134 to a way number of the selected way 122(0)-122(Z) (block 626). The DRAM cache management circuit 102 also sets a dirty indicator 140(0)-140(C), 140'(0)-140'(C) for the write address 130 in the DRAM cache indicator cache 134 (block 628). Processing then continues at block 630 of FIG. 6C.

Figure 6C:
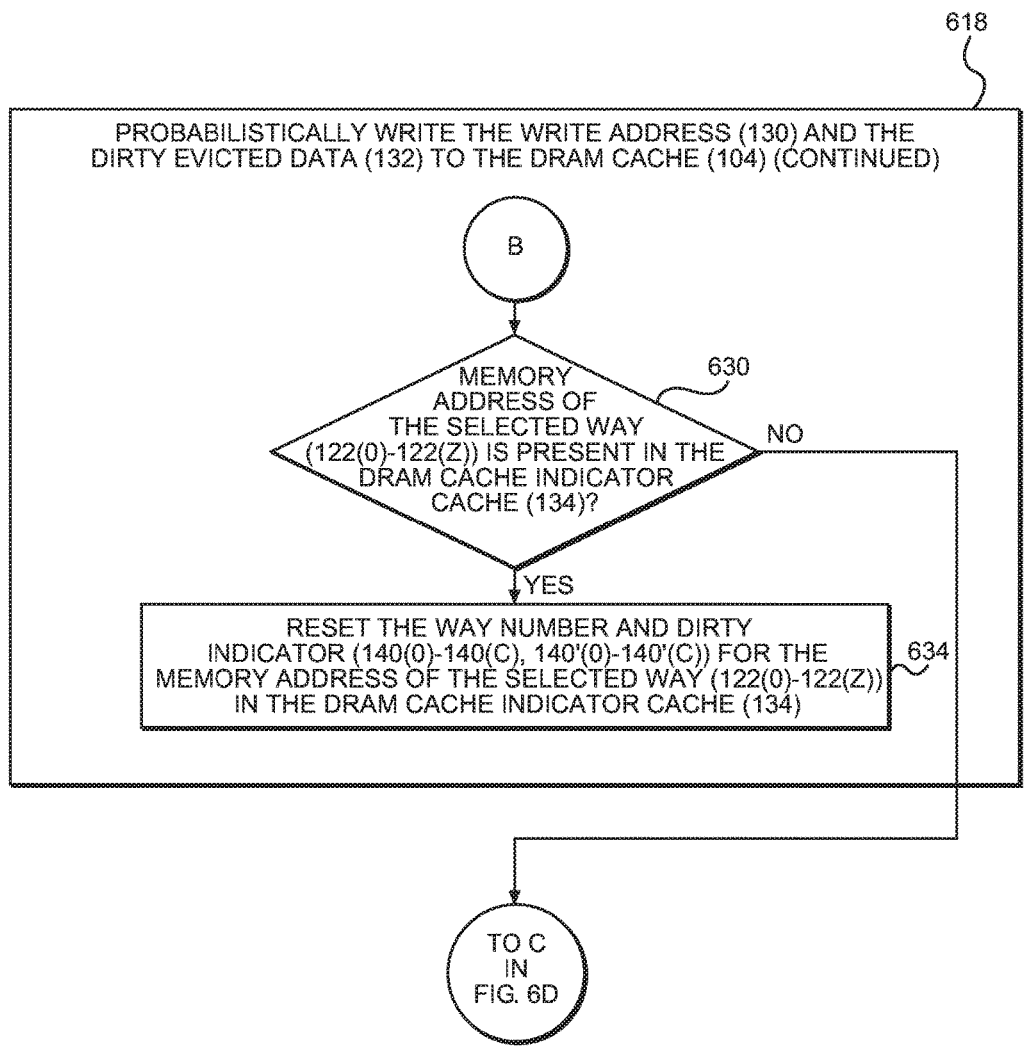

In FIG. 6C, further operations of block 618 for probabilistically writing the write address 130 and the dirty evicted data 132 to the DRAM cache 104 include the DRAM cache management circuit 102 determining whether a memory address of the selected way 122(0)-122(Z) is present in the DRAM cache indicator cache 134 (block 630). If not, processing resumes at block 632 in FIG. 6D. If the DRAM cache management circuit 102 determines at decision block 630 that the memory address of the selected way 122(0)-122(Z) is present in the DRAM cache indicator cache 134, the DRAM cache management circuit 102 resets the way number and a dirty indicator 140(0)-140(C), 140'(0)-140'(C) of the selected way 122(0)-122(Z) for the memory address in the DRAM cache indicator cache 134 (block 634).

Figure 6D:
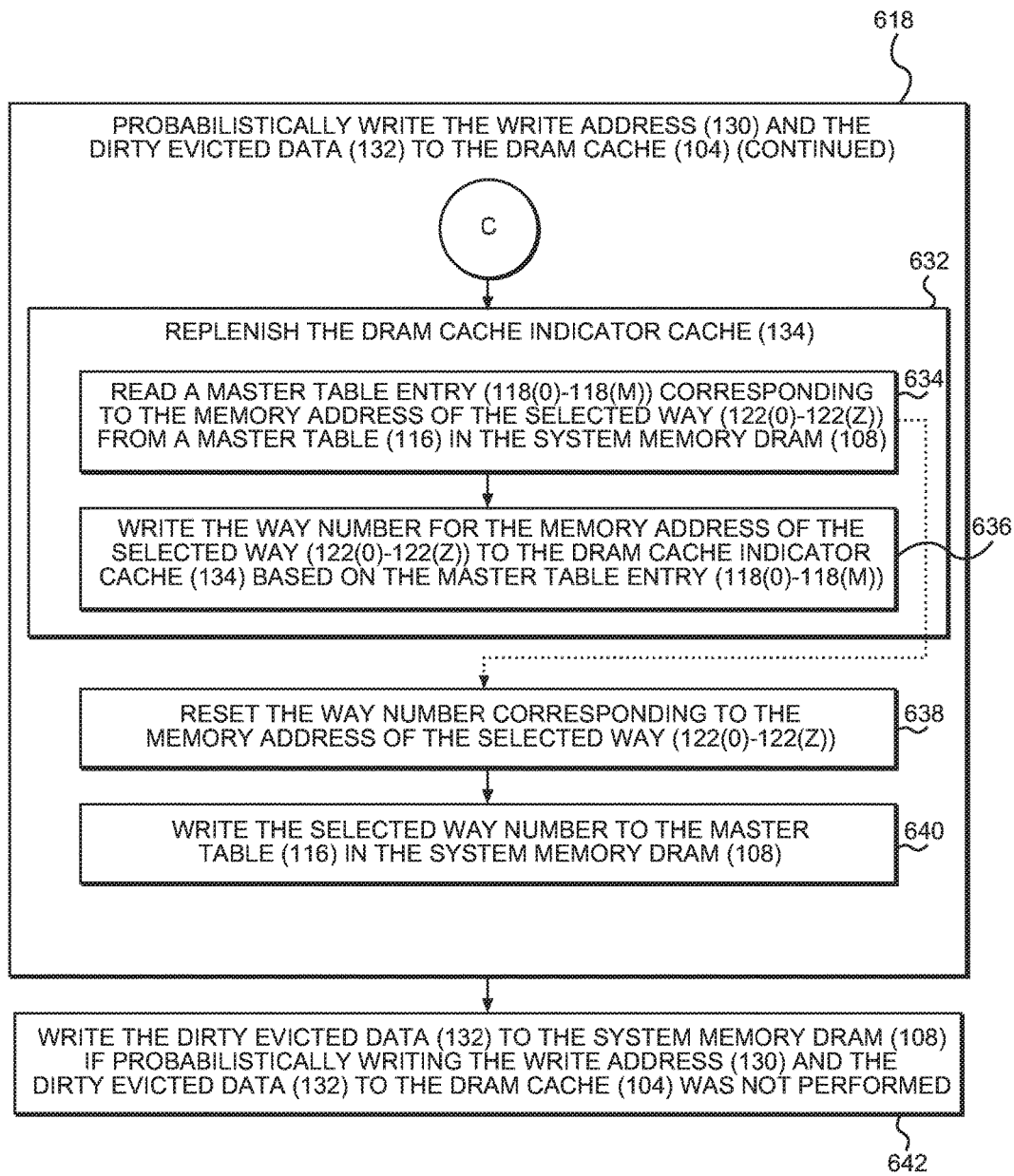

Referring now to FIG. 6D, if the DRAM cache management circuit 102 determines at decision block 630 of FIG. 6C that the memory address of the selected way 122(0)-122(Z) is not present in the DRAM cache indicator cache 134, the DRAM cache management circuit 102 replenishes the DRAM cache indicator cache 134 (block 632). In some aspects, operations of block 632 for replenishing the DRAM cache indicator cache 134 include reading the master table entry 118(0)-118(M) of the selected way 122(0)-122(Z) corresponding to the memory address from the master table 116 in the system memory DRAM 108 (block 634). The DRAM cache management circuit 102 in some aspects may next write the way number of the selected way 122(0)-122(Z) for the memory address to the DRAM cache indicator cache 134 based on the master table entry 118(0)-118(M) (block 636). In some aspects, the DRAM cache management circuit 102 resets the way number of the selected way 122(0)-122(Z) corresponding to the memory address (block 638). The DRAM cache management circuit 102 then writes the way number to the master table 116 in the system memory DRAM 108 (without installing the master table entry 118(0)-118(M) in the DRAM cache indicator cache 134) (block 640). If the write address 130 and the dirty evicted data 132 were not probabilistically written to the DRAM cache 104 in block 618, the DRAM cache management circuit 102 writes the dirty evicted data 132 to the system memory DRAM 108 (block 642).

Providing scalable DRAM cache management using DRAM cache indicator caches according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
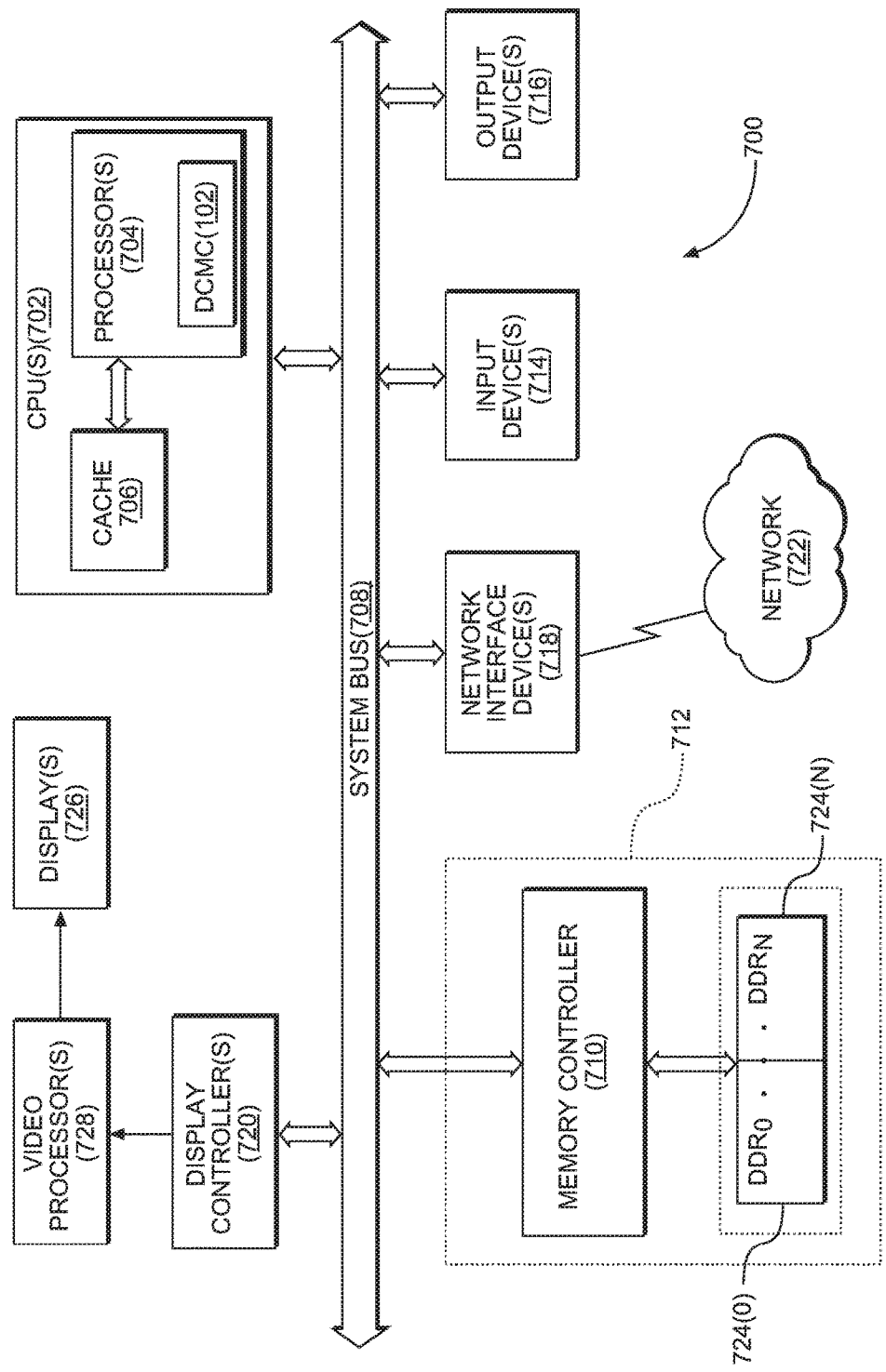
FIG. 7 is a block diagram of an exemplary processor-based system that can include the DRAM cache management circuit of FIG. 1.

In this regard, FIG. 7 illustrates an example of a processor-based system 700 that can employ the DRAM cache management circuit (DCMC) 102 illustrated in FIG. 1. The processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including but not limited to input keys, switches, voice processors, etc. The output device(s) 716 can include any type of output device, including, but not limited to, audio, video, other visual indicators, etc. The network interface device(s) 718 can be any devices configured to allow exchange of data to and from a network 722. The network 722 can be any type of network, including, but not limited to, a wired or wireless network, a private or public network, a local area network (LAN), a wireless local area network (WLAN), a wide area network (WAN), a BLU- ETOOTH™ network, and the Internet. The network interface device(s) 718 can be configured to support any type of communications protocol desired. The memory system 712 can include one or more memory units 724(0)-724(N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A dynamic random access memory (DRAM) cache management circuit, communicatively coupled to a DRAM cache that is part of a high-bandwidth memory and further communicatively coupled to a system memory DRAM;
the DRAM cache management circuit comprising a DRAM cache indicator cache configured to cache a plurality of DRAM cache indicators read from a master table in the system memory DRAM, the plurality of DRAM cache indicators indicating whether a corresponding memory line of the system memory DRAM is cached in the DRAM cache;
the DRAM cache management circuit configured to:
receive a memory read request comprising a read address;
determine whether the read address is found in the DRAM cache indicator cache;
responsive to determining that the read address is not found in the DRAM cache indicator cache, read data at the read address in the system memory DRAM; and
responsive to determining that the read address is found in the DRAM cache indicator cache:
determine, based on the DRAM cache indicator cache, whether the read address is found in the DRAM cache;
responsive to determining that the read address is not found in the DRAM cache, read data at the read address in the system memory DRAM; and
responsive to determining that the read address is found in the DRAM cache, read data for the read address from the DRAM cache.

2. The DRAM cache management circuit of claim 1, configured to operate in a write-back mode, and further configured to, responsive to determining that the read address is found in the DRAM cache, determine whether the data for the read address in the DRAM cache is clean;
  wherein the DRAM cache management circuit is configured to read the data for the read address from the DRAM cache further responsive to determining that the data for the read address in the DRAM cache is not clean.

3. The DRAM cache management circuit of claim 2, further configured to, responsive to determining that the data for the read address in the DRAM cache is clean:
  identify, based on a load balancing circuit of the DRAM cache management circuit, a preferred data source from among the DRAM cache and the system memory DRAM;
  responsive to identifying the DRAM cache as the preferred data source, read data from the DRAM cache; and
  responsive to identifying the system memory DRAM as the preferred data source, read data from the system memory DRAM.

4. The DRAM cache management circuit of claim 1, configured to operate in a write-through mode, and further configured to, responsive to determining that the read address is found in the DRAM cache:
  identify, based on a load balancing circuit of the DRAM cache management circuit, a preferred data source from among the DRAM cache and the system memory DRAM; and
  responsive to identifying the system memory DRAM as the preferred data source, read data from the system memory DRAM;
  wherein the DRAM cache management circuit is configured to read the data for the read address from the DRAM cache further responsive to determining that the data for the read address in the DRAM cache is clean and identifying the DRAM cache as the preferred data source.

5. The DRAM cache management circuit of claim 1, wherein:
  the DRAM cache management circuit is further coupled to a system cache; and
  the DRAM cache management circuit is configured to receive the memory read request comprising the read address responsive to a miss on the system cache.

6. The DRAM cache management circuit of claim 1, configured to probabilistically replenish the DRAM cache indicator cache after reading the data at the read address in the system memory DRAM.

7. The DRAM cache management circuit of claim 1, configured to determine, based on the DRAM cache indicator cache, whether the read address is found in the DRAM cache by being configured to determine if a way number for the read address in the DRAM cache is non-zero.

8. The DRAM cache management circuit of claim 1, further configured to:
  receive, from a system cache, a memory write request comprising a write address and write data comprising clean evicted data;
  determine whether the write address is found in the DRAM cache; and
  responsive to determining that the write address is not found in the DRAM cache, probabilistically write the write address and the clean evicted data to the DRAM cache.

9. The DRAM cache management circuit of claim 8, further configured to, prior to determining whether the write address is found in the DRAM cache:
  determine whether the write address is found in the DRAM cache indicator cache; and
  responsive to determining that the write address is not found in the DRAM cache indicator cache, probabilistically replenish the DRAM cache indicator cache;
  wherein the DRAM cache management circuit is configured to determine whether the write address is found in the DRAM cache responsive to replenishing the DRAM cache indicator cache.

10. The DRAM cache management circuit of claim 8, configured to probabilistically write the write address and the clean evicted data to the DRAM cache by being configured to:
  select a way to be evicted from the DRAM cache;
  read a memory address of the selected way from the DRAM cache;
  write the write address and the clean evicted data to the selected way in the DRAM cache;
  update a way number for the write address in the DRAM cache indicator cache to a way number of the selected way;
  determine whether the memory address of the selected way is present in the DRAM cache indicator cache; and
  responsive to determining that the memory address of the selected way is present in the DRAM cache indicator cache, reset the way number of the selected way for the memory address in the DRAM cache indicator cache.

11. The DRAM cache management circuit of claim 10, further configured to, responsive to determining that the memory address of the selected way is not present in the DRAM cache indicator cache, replenish the DRAM cache indicator cache by being configured to:
  read a master table entry of the selected way corresponding to the memory address; and
  write the way number of the selected way for the memory address to the DRAM cache indicator cache based on the master table entry.

12. The DRAM cache management circuit of claim 10, further configured to, responsive to determining that the memory address of the selected way is not present in the DRAM cache indicator cache:
  reset the way number of the selected way corresponding to the memory address; and
  write the way number to the master table.

13. The DRAM cache management circuit of claim 1, configured to operate in a write-through mode, and further configured to:
  receive, from a system cache, a memory write request comprising a write address and write data comprising dirty evicted data;
  determine whether the write address is found in the DRAM cache;
  responsive to determining that the write address is not found in the DRAM cache, probabilistically write the write address and the dirty evicted data to the DRAM cache;
  responsive to determining that the write address is found in the DRAM cache, write the dirty evicted data to the DRAM cache; and
  write the dirty evicted data to the system memory DRAM.

14. The DRAM cache management circuit of claim 13, further configured to, prior to determining whether the write address is found in the DRAM cache:
  determine whether the write address is found in the DRAM cache indicator cache; and responsive to determining that the write address is not found in the DRAM cache indicator cache, probabilistically replenish the DRAM cache indicator cache;
responsive to not replenishing the DRAM cache indicator cache:
update a DRAM cache indicator corresponding to the write address in the master table; and
write the dirty evicted data to the DRAM cache;
wherein the DRAM cache management circuit is configured to determine whether the write address is found in the DRAM cache responsive to replenishing the DRAM cache indicator cache.

15. The DRAM cache management circuit of claim 13, configured to probabilistically write the write address and the dirty evicted data to the DRAM cache by being configured to:
select a way to be evicted from the DRAM cache;
read a memory address of the selected way from the DRAM cache;
write the write address and the dirty evicted data to the selected way in the DRAM cache;
update the way number for the write address in the DRAM cache indicator cache to a way number of the selected way;
determine whether the memory address of the selected way is present in the DRAM cache indicator cache; and
responsive to determining that the memory address of the selected way is present in the DRAM cache indicator cache, reset the way number of the selected way for the memory address in the DRAM cache indicator cache.

16. The DRAM cache management circuit of claim 15, further configured to, responsive to determining that the memory address of the selected way is not present in the DRAM cache indicator cache, replenish the DRAM cache indicator cache by being configured to:
read a master table entry of the selected way corresponding to the memory address; and
write the way number of the selected way for the memory address to the DRAM cache indicator cache based on the master table entry.

17. The DRAM cache management circuit of claim 15, further configured to, responsive to determining that the memory address of the selected way is not present in the DRAM cache indicator cache:
reset the way number of the selected way corresponding to the memory address; and
write the way number to the master table.

18. The DRAM cache management circuit of claim 1, configured to operate in a write-back mode, and further configured to:
receive, from a system cache, a memory write request comprising a write address and write data comprising dirty evicted data;
determine whether the write address is found in the DRAM cache;
responsive to determining that the write address is not found in the DRAM cache, probabilistically write the write address and the dirty evicted data to the DRAM cache;
responsive to not writing the write address and the dirty evicted data to the DRAM cache, write the dirty evicted data to the system memory DRAM; and
responsive to determining that the write address is found in the DRAM cache, write the dirty evicted data to the DRAM cache.

19. The DRAM cache management circuit of claim 18, further configured to, prior to determining whether the write address is found in the DRAM cache:
determine whether the write address is found in the DRAM cache indicator cache; and
responsive to determining that the write address is not found in the DRAM cache indicator cache, probabilistically replenish the DRAM cache indicator cache;
responsive to not replenishing the DRAM cache indicator cache:
read a DRAM cache indicator for the write address from the master table;
write the dirty evicted data to the system memory DRAM; and
determine whether the DRAM cache indicator for the write address from the master table indicates that the write address is in the DRAM cache;
wherein the DRAM cache management circuit is configured to determine whether the write address is found in the DRAM cache responsive to replenishing the DRAM cache indicator cache.

20. The DRAM cache management circuit of claim 18, configured to probabilistically write the write address and the dirty evicted data to the DRAM cache by being configured to:
select a way to be evicted from the DRAM cache;
read a memory address of the selected way from the DRAM cache;
after reading the memory address of the selected way from the DRAM cache, write the write address and the dirty evicted data to the selected way in the DRAM cache;
update a way number for the write address in the DRAM cache indicator cache to a way number of the selected way;
set a dirty indicator for the write address in the DRAM cache indicator cache;
determine whether the memory address of the selected way is present in the DRAM cache indicator cache; and
responsive to determining that the memory address of the selected way is present in the DRAM cache indicator cache, reset the way number and the dirty indicator for the write address of the selected way in the DRAM cache indicator cache.

21. The DRAM cache management circuit of claim 20, further configured to, responsive to determining that the memory address of the selected way is not present in the DRAM cache indicator cache, replenish the DRAM cache indicator cache by being configured to:
read a master table entry of the selected way corresponding to the memory address; and
write the way number of the selected way for the memory address to the DRAM cache indicator cache based on the master table entry.

22. The DRAM cache management circuit of claim 20, further configured to, responsive to determining that the memory address of the selected way is not present in the DRAM cache indicator cache:
reset the way number of the selected way corresponding to the memory address; and
write the way number to the master table.

23. The DRAM cache management circuit of claim 1 integrated into an integrated circuit (IC).

24. The DRAM cache management circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

25. A method for providing scalable dynamic random access memory (DRAM) cache management, comprising:
receiving, by a DRAM cache management circuit, a memory read request comprising a read address;
determining whether the read address is found in a DRAM cache indicator cache of the DRAM cache management circuit;
responsive to determining that the read address is not found in the DRAM cache indicator cache, reading data at the read address in a system memory DRAM; and
responsive to determining that the read address is found in the DRAM cache indicator cache:
determining, based on the DRAM cache indicator cache, whether the read address is found in a DRAM cache that is part of a high-bandwidth memory;
responsive to determining that the read address is not found in the DRAM cache, reading data at the read address in the system memory DRAM; and
responsive to determining that the read address is found in the DRAM cache, reading data for the read address from the DRAM cache.

26. The method of claim 25, wherein the DRAM cache management circuit is configured to operate in a write-back mode, and further comprising, responsive to determining that the read address is found in the DRAM cache, determining whether the data for the read address in the DRAM cache is clean;
wherein reading the data for the read address from the DRAM cache is further responsive to determining that the data for the read address in the DRAM cache is not clean.

27. The method of claim 26, further comprising, responsive to determining that the data for the read address in the DRAM cache is clean:
identifying a preferred data source from among the DRAM cache and the system memory DRAM;
responsive to identifying the DRAM cache as the preferred data source, reading data from the DRAM cache; and
responsive to identifying the system memory DRAM as the preferred data source, reading data from the system memory DRAM.

28. The method of claim 25, wherein the DRAM cache management circuit is configured to operate in a write-through mode, and further comprising, responsive to determining that the read address is found in the DRAM cache:
identifying a preferred data source from among the DRAM cache and the system memory DRAM; and
responsive to identifying the system memory DRAM as the preferred data source, reading data from the system memory DRAM;
wherein reading the data for the read address from the DRAM cache is further responsive to determining that the data for the read address in the DRAM cache is clean and identifying the DRAM cache as the preferred data source.

29. The method of claim 25, wherein receiving the memory read request comprising the read address is responsive to a miss on a system cache.

30. The method of claim 25, further comprising probabilistically replenishing the DRAM cache indicator cache after reading the data at the read address in the system memory DRAM.

31. The method of claim 25, further comprising determining, based on the DRAM cache indicator cache, whether the read address is found in the DRAM cache by determining if a way number for the read address in the DRAM cache is non-zero.

32. The method of claim 25, further comprising:
receiving, from a system cache, a memory write request comprising a write address and write data comprising clean evicted data;
determining whether the write address is found in the DRAM cache; and
responsive to determining that the write address is not found in the DRAM cache, probabilistically writing the write address and the clean evicted data to the DRAM cache.

33. The method of claim 32, further comprising, prior to determining whether the write address is found in the DRAM cache:
determining whether the write address is found in the DRAM cache indicator cache; and
responsive to determining that the write address is not found in the DRAM cache indicator cache, probabilistically replenishing the DRAM cache indicator cache;
wherein determining whether the write address is found in the DRAM cache is responsive to replenishing the DRAM cache indicator cache.

34. The method of claim 32, comprising probabilistically writing the write address and the clean evicted data to the DRAM cache by:
selecting a way to be evicted from the DRAM cache;
reading a memory address of the selected way from the DRAM cache;
writing the write address and the clean evicted data to the selected way in the DRAM cache;
updating a way number for the write address in the DRAM cache indicator cache to a way number of the selected way;
determining whether the memory address of the selected way is present in the DRAM cache indicator cache; and
responsive to determining that the memory address of the selected way is present in the DRAM cache indicator cache, resetting the way number of the selected way for the memory address in the DRAM cache indicator cache.

35. The method of claim 34, further comprising, responsive to determining that the memory address of the selected way is not present in the DRAM cache indicator cache, replenishing the DRAM cache indicator cache by:
reading a master table entry of the selected way corresponding to the memory address from a master table in the system memory DRAM; and
writing the way number of the selected way for the memory address to the DRAM cache indicator cache based on the master table entry.

36. The method of claim 34, further comprising, responsive to determining that the memory address of the selected way is not present in the DRAM cache indicator cache:
resetting the way number of the selected way corresponding to the memory address; and
writing the way number to a master table in the system memory DRAM.

37. The method of claim 25, wherein the DRAM cache management circuit is configured to operate in a write-through mode, and further comprises:
- receiving, from a system cache, a memory write request comprising a write address and write data comprising dirty evicted data;
- determining whether the write address is found in the DRAM cache;
- responsive to determining that the write address is not found in the DRAM cache, probabilistically writing the write address and the dirty evicted data to the DRAM cache;
- responsive to determining that the write address is found in the DRAM cache, writing the dirty evicted data to the DRAM cache; and
- writing the dirty evicted data to the system memory DRAM.

38. The method of claim 37, further comprising, prior to determining whether the write address is found in the DRAM cache:
- determining whether the write address is found in the DRAM cache indicator cache; and
- responsive to determining that the write address is not found in the DRAM cache indicator cache, probabilistically replenishing the DRAM cache indicator cache;
- responsive to not replenishing the DRAM cache indicator cache:
  - updating a DRAM cache indicator corresponding to the write address in a master table in the system memory DRAM; and
  - writing the dirty evicted data to the DRAM cache;
- wherein determining whether the write address is found in the DRAM cache is responsive to replenishing the DRAM cache indicator cache.

39. The method of claim 37, wherein probabilistically writing the write address and the dirty evicted data to the DRAM cache comprises:
- selecting a way to be evicted from the DRAM cache;
- reading a memory address of the selected way from the DRAM cache;
- writing the write address and the dirty evicted data to the selected way in the DRAM cache;
- updating a way number for the write address in the DRAM cache indicator cache to a way number of the selected way;
- determining whether the memory address of the selected way is present in the DRAM cache indicator cache; and
- responsive to determining that the memory address of the selected way is present in the DRAM cache indicator cache, resetting the way number of the selected way for the memory address in the DRAM cache indicator cache.

40. The method of claim 39, further comprising, responsive to determining that the memory address of the selected way is not present in the DRAM cache indicator cache, replenishing the DRAM cache indicator cache by:
- reading a master table entry of the selected way corresponding to the memory address; and
- writing the way number of the selected way for the memory address to the DRAM cache indicator cache based on the master table entry.

41. The method of claim 39, further comprising, responsive to determining that the memory address of the selected way is not present in the DRAM cache indicator cache:
- resetting the way number of the selected way corresponding to the memory address; and
- writing the way number to a master table in the system memory DRAM.

42. The method of claim 25, wherein the DRAM cache management circuit is configured to operate in a write-back mode, and further comprises:
- receiving, from a system cache, a memory write request comprising a write address and write data comprising dirty evicted data;
- determining whether the write address is found in the DRAM cache;
- responsive to determining that the write address is not found in the DRAM cache, probabilistically writing the write address and the dirty evicted data to the DRAM cache;
  - responsive to not writing the write address and the dirty evicted data to the DRAM cache, writing the dirty evicted data to the system memory DRAM; and
  - responsive to determining that the write address is found in the DRAM cache, writing the dirty evicted data to the DRAM cache.

43. The method of claim 42, further comprising, prior to determining whether the write address is found in the DRAM cache:
- determining whether the write address is found in the DRAM cache indicator cache; and
- responsive to determining that the write address is not found in the DRAM cache indicator cache, probabilistically replenishing the DRAM cache indicator cache;
- responsive to not replenishing the DRAM cache indicator cache:
  - updating a DRAM cache indicator corresponding to the write address in a master table in the system memory DRAM;
  - writing the dirty evicted data to the system memory DRAM; and
  - determining whether the DRAM cache indicator for the write address from the master table indicates that the write address is in the DRAM cache;
- wherein determining whether the write address is found in the DRAM cache is responsive to replenishing the DRAM cache indicator cache.

44. The method of claim 42, wherein probabilistically writing the write address and the dirty evicted data to the DRAM cache comprises:
- selecting a way to be evicted from the DRAM cache;
- reading a memory address of the selected way from the DRAM cache;
- after reading the memory address of the selected way from the DRAM cache, writing the write address and the dirty evicted data to the selected way in the DRAM cache;
- updating a way number for the write address in the DRAM cache indicator cache to a way number of the selected way;
- setting a dirty indicator for the write address in the DRAM cache indicator cache;
- determining whether the memory address of the selected way is present in the DRAM cache indicator cache; and
- responsive to determining that the memory address of the selected way is present in the DRAM cache indicator cache, resetting the way number and the dirty indicator of the selected way for the write address in the DRAM cache indicator cache.

45. The method of claim 44, further comprising, responsive to determining that the memory address of the selected way is not present in the DRAM cache indicator cache, replenishing the DRAM cache indicator cache by:
- reading a master table entry of the selected way corresponding to the memory address; and
- writing the way number of the selected way for the memory address to the DRAM cache indicator cache based on the master table entry.

46. The method of claim 44, further comprising, responsive to determining that the memory address of the selected way is not present in the DRAM cache indicator cache:
- resetting the way number of the selected way corresponding to the memory address; and
- writing the way number to a master table in the system memory DRAM.

47. A dynamic random access memory (DRAM) cache management circuit, comprising:
- a means for receiving a memory read request comprising a read address;
- a means for determining whether the read address is found in a DRAM cache indicator cache of the DRAM cache management circuit;
- a means for reading data at the read address in a system memory DRAM, responsive to determining that the read address is not found in the DRAM cache indicator cache;
- a means for determining, based on the DRAM cache indicator cache, whether the read address is found in a DRAM cache that is part of a high-bandwidth memory, responsive to determining that the read address is found in the DRAM cache indicator cache;
- a means for reading data at the read address in the system memory DRAM, responsive to determining that the read address is not found in the DRAM cache; and
- a means for reading data for the read address from the DRAM cache, responsive to determining that the read address is found in the DRAM cache.

* * * * *